United States Patent
Kim

(10) Patent No.: US 9,508,423 B2
(45) Date of Patent: Nov. 29, 2016

(54) NONVOLATILE MEMORY DEVICE AND METHOD OF READING THE SAME

(71) Applicant: SAMSUNG ELECTRONICS CO., LTD., Suwon-Si, Gyeonggi-Do (KR)

(72) Inventor: Boh-Chang Kim, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/990,817

(22) Filed: Jan. 8, 2016

(65) Prior Publication Data

US 2016/0225439 A1 Aug. 4, 2016

(30) Foreign Application Priority Data

Feb. 2, 2015 (KR) .................. 10-2015-0016170

(51) Int. Cl.
*G11C 16/04* (2006.01)
*G11C 11/56* (2006.01)
*G11C 16/10* (2006.01)

(52) U.S. Cl.
CPC ........ *G11C 11/5642* (2013.01); *G11C 11/5621* (2013.01); *G11C 11/5635* (2013.01); *G11C 16/0483* (2013.01); *G11C 16/10* (2013.01); *G11C 11/5628* (2013.01)

(58) Field of Classification Search
CPC ............... G11C 11/5642; G11C 11/5621; G11C 11/5628; G11C 11/5635; G11C 16/10; G11C 16/0483
USPC .......................... 365/185.03, 185.12, 185.23
See application file for complete search history.

(56) References Cited

U.S. PATENT DOCUMENTS

| 7,518,923 | B2 | 4/2009 | Mokhlesi |
| 7,619,920 | B2 | 11/2009 | Shiga |
| 7,672,162 | B2 | 3/2010 | Hwang |
| 7,679,133 | B2 | 3/2010 | Son et al. |
| 7,843,724 | B2 | 11/2010 | Shiga et al. |
| 7,894,258 | B2 * | 2/2011 | Jeong ................. G11C 16/3454 365/185.03 |
| 7,911,846 | B2 | 3/2011 | Hemink |
| 8,553,466 | B2 | 10/2013 | Han et al. |
| 8,559,235 | B2 | 10/2013 | Yoon et al. |
| 8,565,022 | B2 * | 10/2013 | Shin .................... G11C 11/5628 365/185.03 |
| 8,599,610 | B2 | 12/2013 | Nawata |
| 8,654,587 | B2 | 2/2014 | Yoon et al. |
| 8,705,276 | B2 * | 4/2014 | Lee ........................ G11C 16/06 365/185.03 |
| 9,042,172 | B2 * | 5/2015 | Kim ....................... G11C 16/06 365/185.12 |
| 9,190,164 | B1 * | 11/2015 | Kim ....................... G11C 16/26 |
| 2011/0233648 | A1 | 9/2011 | Seol et al. |
| 2011/0235413 | A1 | 9/2011 | Kamigaichi |
| 2013/0329495 | A1 | 12/2013 | Shiino et al. |
| 2014/0173174 | A1 | 6/2014 | Frickey et al. |

FOREIGN PATENT DOCUMENTS

KR 1020110116473 A 10/2011

* cited by examiner

*Primary Examiner* — Pho M Luu
(74) *Attorney, Agent, or Firm* — Volentine & Whitt, PLLC

(57) ABSTRACT

A read method of a nonvolatile memory device includes determining whether a selected word line comprises LSB (least significant bit) page only programmed memory cells by applying a first read voltage to the selected word line. In the case that the selected word line comprises LSB (least significant bit) page only programmed memory cells, counting the number of off-cells by applying the first read voltage to the selected word line. And in a read operation, changing a select read voltage being applied to the selected word line according to the number of off-cells.

20 Claims, 16 Drawing Sheets

FIG. 6

| | Case 1 | | | Case 2 | | | Case 3 | | |
|---|---|---|---|---|---|---|---|---|---|
| | LSB State | MSB State | WL Voltage | LSB State | MSB State | WL Voltage | LSB State | MSB State | WL Voltage |
| WL7 | E | | Vread | E | | Vread | E | | Vread |
| WL6 | E | | Vread-α | E | | Vread | E | | Vread |
| WL5 | P | | VR1 | E | | Vread-α / VR1+b | P | | Vread-α / VR1+a |
| WL4 | P | | Vread-α | P | | | P | | |
| WL3 | P | P | Vread | P | P | Vread | P | P | Vread |
| WL2 | P | P | Vread | P | P | Vread | P | P | Vread |
| WL1 | P | P | Vread | P | P | Vread | P | P | Vread |

□ : Selected WL    P : Program State
▨ : Change WL Voltage    E : Erase State

FIG. 11

|  | Case 4 | | | Case 5 | | | Case 6 | | |
|---|---|---|---|---|---|---|---|---|---|
|  | LSB State | MSB State | WL Voltage | LSB State | MSB State | WL Voltage | LSB State | MSB State | WL Voltage |
| WL7 | E |  | Vread | E |  | Vread | E |  | Vread |
| WL6 | E |  | Vread-α | E |  | Vread | E |  | Vread |
| WL5 | P |  | VR1 | E |  | Vread-α | P |  | Vread-α |
| WL4 | P |  | Vread-β | P |  | VR1+b | P |  | VR1+a |
| WL3 | P | P | Vread | P | P | Vread | P | P | Vread |
| WL2 | P | P | Vread | P | P | Vread | P | P | Vread |
| WL1 | P | P | Vread | P | P | Vread | P | P | Vread |

☐ : Selected WL     P : Program State

▨ : Change WL Voltage     E : Erase State

US 9,508,423 B2

NONVOLATILE MEMORY DEVICE AND METHOD OF READING THE SAME

CROSS-REFERENCE TO RELATED APPLICATIONS

This U.S. non-provisional patent application claims priority under 35 U.S.C. §119 to Korean Patent Application No. 10-2015-0016170, filed on Feb. 2, 2015, the entire contents of which are hereby incorporated by reference.

BACKGROUND OF THE RELATED ART

The disclosure relates to a semiconductor memory device, and more particularly, to a nonvolatile memory device and a method of reading the same.

A semiconductor memory device is classified into a volatile semiconductor memory device and a nonvolatile semiconductor memory device.

A volatile semiconductor memory device has a high read speed and a high write speed. However, it loses its stored data when its power is interrupted. A nonvolatile semiconductor memory device retains its stored data even when its power is interrupted. Thus, the nonvolatile semiconductor memory device is used to remember contents that have to be preserved regardless of whether power is supplied or not. Examples of a nonvolatile semiconductor memory device include an MROM (mask read only memory), a PROM (programmable ROM), an EPROM (erasable programmable ROM), an EEPROM (electrically EPROM), etc.

Generally, because an erase operation and a write operation cannot be performed autonomously in an MROM, a PROM and an EPROM, it is not easy for general users to renew memory contents. Since an EEPROM is capable of electrically performing an erase operation and a write operation, an application of the EEPROM extends to system programming that requires continuous renewal or an auxiliary memory device. In particular, since a flash EEPROM has a high integration compared with an existing EEPROM, it is of great advantage to an application to have a large capacity auxiliary memory device. A NAND type flash EEPROM (hereinafter it is referred to as 'NAND-type flash memory') among flash EEPROMs has a high integration compared with other flash EEPROMs.

In a flash memory device, a data state capable of being stored in each memory cell is determined depending on the number of bits being stored in each memory cell. A memory cell storing 1-bit data in one memory cell is called a single bit cell or a SLC (single-level cell). A memory cell storing multi-bit data in one memory cell is called a multi-bit cell, a MLC (multi-level cell) or a multi-state cell. As a high integration requirement for a memory device increases, a study of a multi-level flash memory storing multi-bit data in one memory cell is vigorously proceeding.

SUMMARY

Embodiments of the disclosure provide a read method of a nonvolatile memory device. The read method may include determining whether a selected word line comprises LSB (least significant bit) page only programmed memory cells by applying a first read voltage to the selected word line; in the case that the selected word line comprises LSB (least significant bit) page only programmed memory cells, counting the number of off-cells by applying the first read voltage to the selected word line; and in a read operation, changing a select read voltage being applied to the selected word line according to the number of off-cells.

Embodiments of the disclosure also provide a read method of a nonvolatile memory device. The read method may include determining whether a flag cell included in a selected word line is turned on by applying a first select read voltage to the selected word line; in the case that the selected word line is turned on, counting the number of fail bits by applying the first select read voltage to the selected word line; and in the case that the number of fail bits is greater than a first reference value, performing a read operation by applying a first additional select read voltage higher than a second select read voltage. The second select read voltage has a level for distinguishing between an erase state and a program state adjacent to the erase state.

Embodiments of the disclosure also provide a nonvolatile memory device. The nonvolatile memory device may include a memory cell array comprising memory cells and flag cells that are connected to one another through word lines. Control logic determines whether a selected word line comprises LSB page only programmed memory cells by applying a first select read voltage to a flag cell connected to the selected word line. The control logic determines whether a second select read voltage is changed by applying the first select read voltage to the selected word line to compare the number of detected fail bits with predetermined reference values. The second select read voltage has a level for distinguishing between an erase state and a program state adjacent to the erase state.

Embodiments of the disclosure also provide a memory system. The memory system may include a nonvolatile memory device comprising memory cells and flag cells that are connected through word lines. A controller determines whether a selected word line comprises LSB page only programmed memory cells by applying a first select read voltage to a flag cell connected to the selected word line. The controller determines whether a second select read voltage is changed by applying the first select read voltage to the selected word line to compare the number of detected fail bits with predetermined reference values. The second select read voltage has a level for distinguishing between an erase state and a program state adjacent to the erase state.

Embodiments of the disclosure also provide a method, executed by a memory controller, of reading data stored by memory cells of a nonvolatile memory device addressed by a selected word line. The method includes reading a flag bit value stored by a first memory cell addressed by the selected word line; identifying the selected word line as least-significant bit (LSB) programmed when the flag bit has a first value and identifying the selected word line as most-significant bit (MSB) programmed when the flag bit has a second value differing from the first value; applying a first read voltage to the selected word line to identify, as the number of failed-read cells, the number of memory cells addressed by the selected word line storing a voltage exceeding the first read voltage; and applying a second read voltage to the selected word line to perform a read operation of the memory cells addressed by the selected word line. The second read voltage exceeds a third read voltage by a first amount when the identified number of failed-read cells exceeds a first threshold number and the selected word line is identified as LSB programmed. The third read voltage has a level for distinguishing, for each of the memory cells, an erase state from a program state adjacent to the erase state. The selected word line is LSB programmed when all memory cells addressed by the selected word line are programmed to store no more than one bit of data and the selected word line is MSB programmed when a memory cell addressed by the selected word line, other than the first memory cell, is programmed to store more than one bit of data.

BRIEF DESCRIPTION OF THE FIGURES

Preferred embodiments of the disclosure will be described below in more detail with reference to the accompanying drawings. The embodiments of the disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout.

FIG. 6 is a table illustrating a read voltage according to an embodiment of the disclosure.

FIG. 11 is a table illustrating a read voltage according to another embodiment of the disclosure.

DETAILED DESCRIPTION OF PREFERRED EMBODIMENTS

Figure 1:
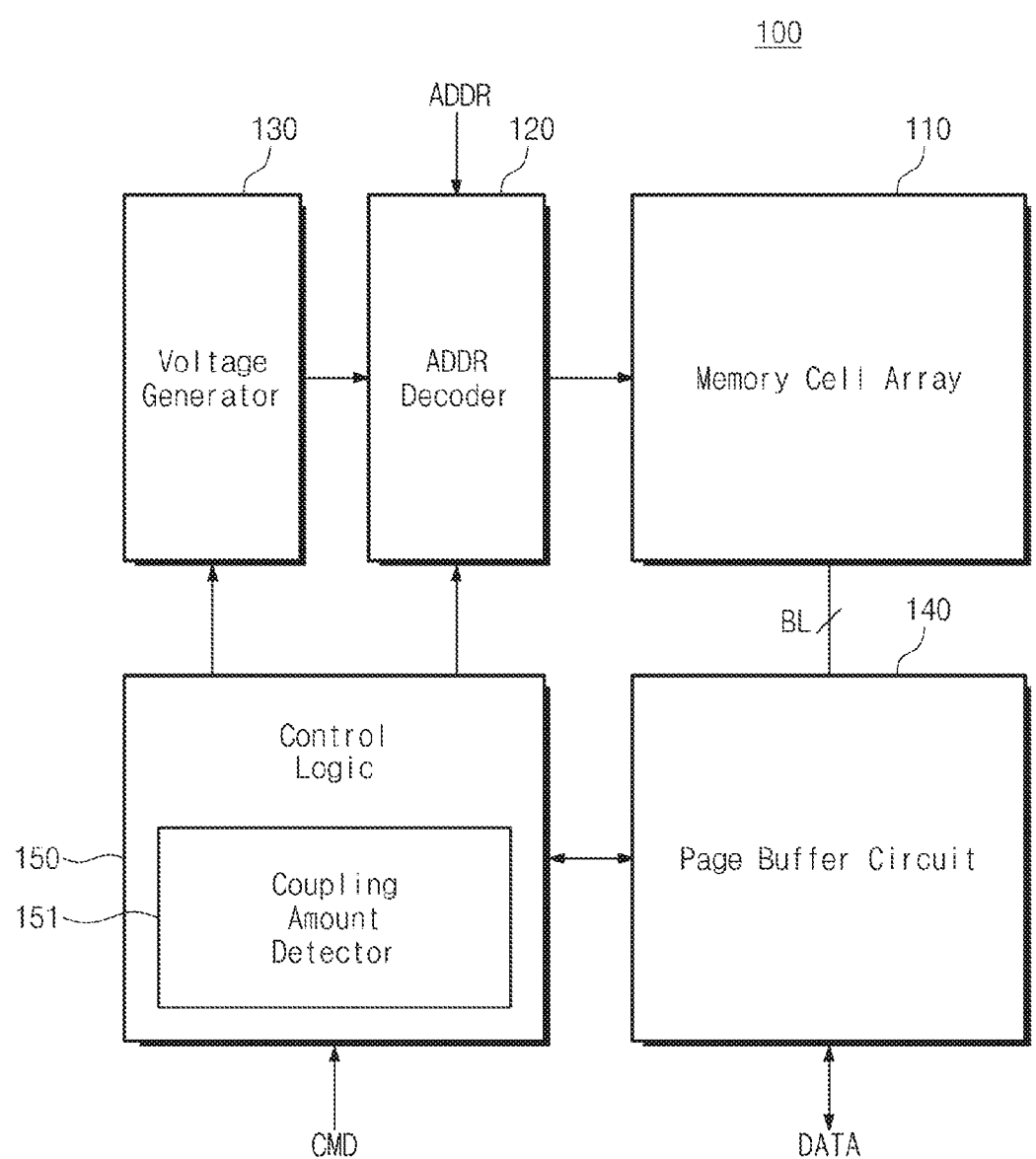
FIG. 1 is a block diagram illustrating a nonvolatile memory device in accordance with the disclosure.

Embodiments of disclosure will be described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. In the drawings, the size and relative sizes of layers and regions may be exaggerated for clarity. Like numbers refer to like elements throughout.

In the description that follows, a nonvolatile memory device is used as an example of a storage device or an electronic device for explaining the feature and the function of the disclosure. However, those skilled in the art will readily appreciate other advantages and performance of the disclosure according to contents specified here. The disclosure may also be embodied or applied through other embodiments. In addition, the detailed description may be modified or changed according to a point of view and an application without departing from the sprit and scope of the disclosure.

In an embodiment of the present disclosure, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present disclosure, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram illustrating a nonvolatile memory device in accordance with the disclosure. Referring to FIG. 1, the nonvolatile memory device 100 may include a memory cell array 110, an address decoder 120, a voltage generator 130, a page buffer circuit 140 and control logic 150.

The memory cell array 110 is connected to the address decoder 120 through string select lines SSL, word lines WL and ground select lines GSL and connected to the page buffer circuit 140 through bit lines BL. The memory cell array 110 may include a plurality of memory blocks. Memory cells of each memory block may form a two-dimensional structure. Memory cells of each memory block may be stacked in a direction perpendicular to a substrate to form a three-dimensional structure. Each memory block may include a plurality of memory cells and a plurality of select transistors. The memory cells may be connected to word lines WL and the select transistors may be connected to string select lines SSL or ground select lines GSL. The memory cells of each memory block may store one or more bits.

The address decoder 120 is connected to the memory cell array 110 through the string select lines SSL, the word lines WL and the ground select lines GSL. The address decoder 120 is configured to operate in response to a control of the control logic 150. The address decoder 120 receives an address ADDR from a controller.

The address decoder 120 is configured to decode a row address within the received address ADDR. Using the decoded row address, the address decoder 120 selects the string select lines SSL, the word lines WL and the ground select lines GSL. The address decoder 120 may receive various voltages from the voltage generator 130 and transmit the received voltages to selected and unselected string select lines SSL, the word lines WL and the ground select lines GSL respectively.

The address decoder 120 may be configured to decode a column address within the transmitted address ADDR. The decoded column address DCA may be transmitted to the page buffer circuit 140. The address decoder 120 may include constitution elements such as a row decoder, a column decoder, an address buffer, etc.

The voltage generator 130 is configured to generate various voltages being required for the nonvolatile memory device 100. For example, the voltage generator 130 can generate a plurality of program voltages, a plurality of pass voltages, a plurality of select read voltages, and a plurality of unselect read voltages.

The page buffer circuit 140 is connected to the memory cell array 110 through the bit lines BL and may exchange data with the controller. The page buffer circuit 140 operates under the control of the control logic 150.

The page buffer circuit 140 receives data, DATA, from the outside and writes the received data in the memory cell array 110. The page buffer circuit 140 reads data from the memory cell array 110 and transmits the read data to the outside. The page buffer circuit 140 can read data from a first storage area of the memory cell array 110 and write the read data in a second storage area of the memory cell array 110. For example, the page buffer circuit 140 may be configured to perform a copy-back operation.

The page buffer circuit 140 may include constitution elements such as a page buffer (or page register), a column select circuit, a data buffer, etc. In another embodiment, the page buffer circuit 140 may include constitution elements such as a sense amplifier, a write driver, a column select circuit, a data buffer, etc.

The control logic 150 may be connected to the address decoder 120, the voltage generator 130, and the page buffer circuit 140. The control logic 150 is configured to control an overall operation of the nonvolatile memory device 100. The control logic 150 operates in response to a control signal, CMD, being transmitted from the controller.

The control logic 150 may include a coupling amount detector 151. The coupling amount detector 151 can detect a coupling amount in a read voltage applied in a read operation. For example, the coupling amount detector 151 can count the number of fail bits in the applied read voltage. The coupling amount detector 151 can compare the number of fail bits with a reference value to change a voltage to be applied to a selected word line. The coupling amount detector 151 can also compare the number of fail bits with a reference value to change an unselect read voltage being applied to at least one word line adjacent to the selected word line. Thus, the nonvolatile memory device 100 can reduce a coupling effect of memory cells in which only the LSB (least significant bit) page is programmed in a read operation.

Figure 2:
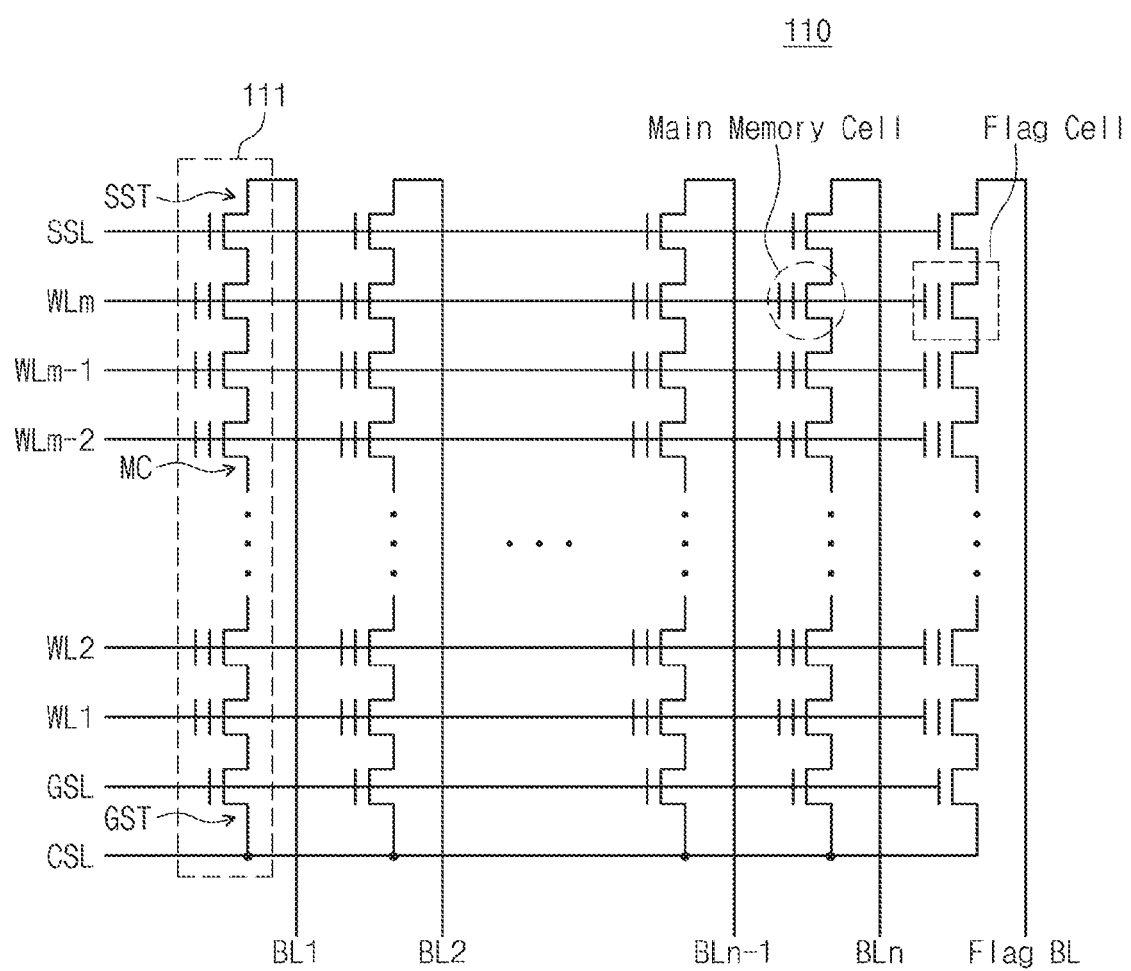
FIG. 2 is a drawing illustrating an example of a constitution of a memory cell array illustrated in FIG. 1.

FIG. 2 is a drawing illustrating an example of a constitution of a memory cell array illustrated in FIG. 1. Referring to FIG. 2, a plurality of memory cells constituting the memory cell array 110 may constitute a plurality of memory blocks MB. Memory cells included in each memory block MB may have a NAND string structure as illustrated in FIG. 2. The constitution of the memory cells illustrated in FIG. 2 is applicable to not only memory cells included in a main area but also memory cells included in a spare area.

Referring to FIG. 2, one memory block MB includes a plurality of strings corresponding to a plurality of columns or bit lines BL1~BLn respectively. Each string 111 includes a string select transistor SST, a plurality of memory cells MC and a ground select transistor GST. In each string 111, a drain of the string select transistor SST is connected to a corresponding bit line and a source of the ground select transistor GST is connected to a common source line CSL. The plurality of memory cells MC is serially connected to one another between a source of the string select transistor SST and a drain of the ground select transistor GST. Control gates of the memory cells arranged in the same row are connected to corresponding word lines WL1~WLm in common. The string select transistor SST is controlled by a voltage being applied through a string select line SSL and the ground select transistor GST is controlled by a voltage being applied through a ground select line GSL. The memory cells MC are controlled by a voltage being applied through the corresponding word lines WL1~WLm. The memory cells MC connected to each of the word lines WL1~WLm store data corresponding to at least one page.

A program or read operation of a NAND type flash memory is performed by a page unit and an erase operation of the programmed data is performed by a block unit which is a unit formed by several pages. Information related to a program or erase operation with respect to each page is stored in a memory cell allocated to the spare area (or a part of the main area). This information is called flag information and a memory cell storing flag information is called a flag cell. By analyzing flag information stored in a flag cell, a program state (in particular, a program state of MSB of a multi level cell) of a corresponding page can be distinguished.

In the case of a multi level cell in which N bit data is stored per cell, a program operation with respect to each bit can be independently performed maximally as much as N times. Each program operation may be constituted by a plurality of program loops. A program operation with respect to each bit (for example, LSB bit, MSB bit) of a multi level cell is performed by a page unit in cells connected to the same word line WL. A page address being allocated in a program operation may be continuously allocated in a word line direction or may be discontinuously allocated. A page address being internally allocated may be internally determined considering the frequency of use of a selected memory cell. Page program performing information (hereinafter it is referred to as flag information) with respect to each page is independently stored in corresponding flag cells.

The flag cell may be configured to distinguish whether memory cells of a corresponding page are programmed or not. For this, the flag cell may be configured so that the flag cell is programmed while memory cells of a corresponding page are MSB-programmed. It may be distinguished whether memory cells of a corresponding page are MSB-programmed according to flag information read from the flag cell.

The flag cell may be constituted by a multi level cell MLC and/or a single level cell SLC having the same structure as the NAND string illustrated in FIG. 2. A physical location where the flag cell is constituted is not limited to a specific area. For example, the flag cell may be formed in the spare area of the memory cell array 110 or may be formed in the main area of the memory cell array 110. The form of the flag cells and the number of the flag cells may be diversely changed depending on a structure of the memory cell array 110. The flag cells within a string are selected by a flag bitline Flag BL.

Figure 3:
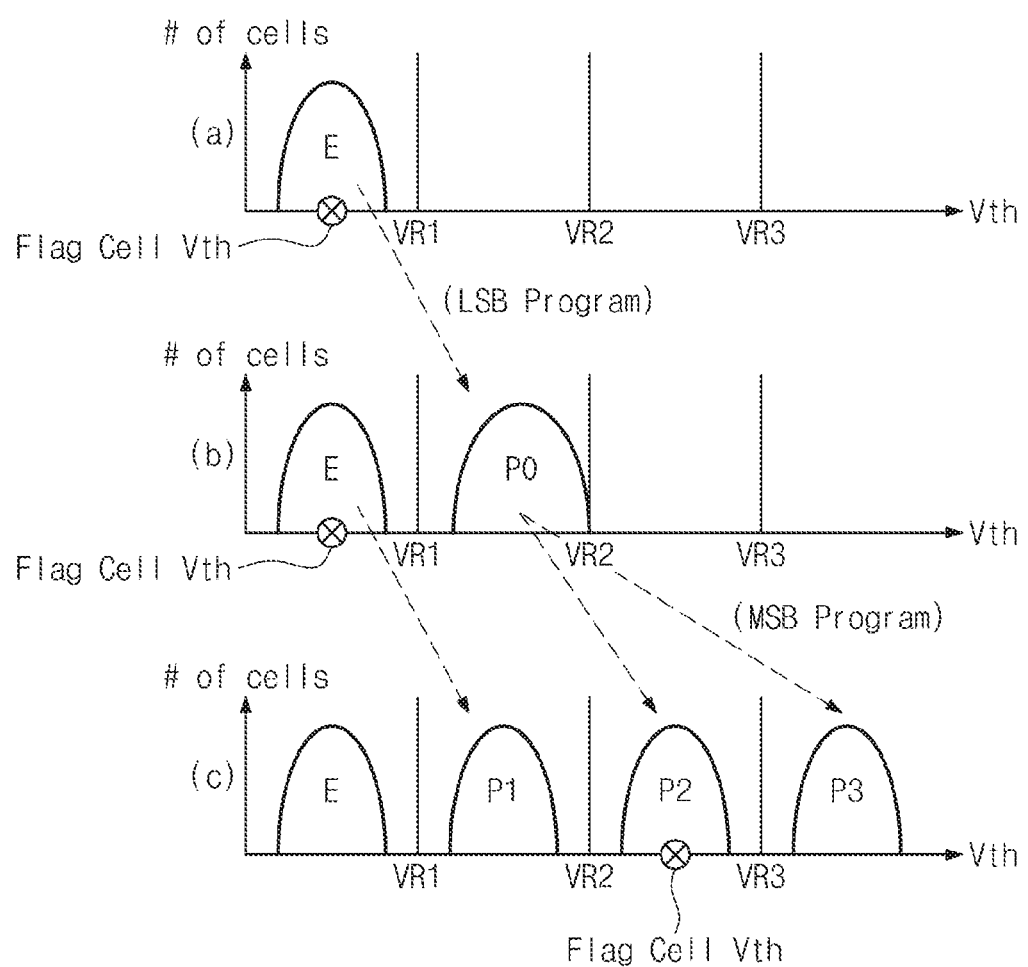
FIG. 3 is a drawing illustrating a program method of a nonvolatile memory device of FIG. 1.

FIG. 3 is a drawing illustrating a program method of a nonvolatile memory device 100 of FIG. 1. Specifically, (a) of FIG. 3 shows a case that the main memory cells (refer to FIG. 2) are in an erase state, (b) of FIG. 3 shows a case that the main memory cells are LSB (least significant bit)-programmed and (c) of FIG. 3 shows a case that the main memory cells are MSB (most significant bit)-programmed.

Referring to FIG. 3, a program operation of a main memory cell (hereinafter it is referred to as 2-bit main memory) storing s-bit data is classified into an LSB program operation and a MSB program operation. That is, the 2-bit main memory cell performs an LSB program operation and then performs a MSB program operation. A program process of a 2-bit main memory cell is as follows.

First, referring to (a) of FIG. 3, main memory cells of an erase state (E) may correspond to data of '11'. After that, as illustrated in (b) of FIG. 3, if an LSB program operation is performed with respect to main memory cells of the erase state (E), the main memory cells maintain the erase state (E) or are programmed in an initial program state (P0). In this case, the main memory cells programmed in an initial program state (P0) may correspond to data of '10'.

After that, as illustrated in (c) of FIG. 3, if a MSB program operation is performed, the main memory cells of the initial program state (P0) are programmed in either a second program state (P2) or a third program state (P3). In this case, main memory cells programmed in the second program state (P2) may correspond to data of '00' and main memory cells programmed in the third program state (P3) may correspond to data of '10'.

If a MSB program operation is performed, the main memory cells of the erase state (E) maintain the erase state (E) or are programmed in a first program state (P1). In this case, the main memory cells programmed in the first program state (P1) may correspond to data of '01'.

As described in FIG. 2, the flag cell stores information (i.e., flag information) about whether a corresponding page is LSB-programmed or MSB-programmed. That is, it may be judged whether the corresponding page is LSB-programmed or MSB-programmed depending on a level of a threshold voltage of the flag cell.

For example, referring to (b) of FIG. 3, in the case that an LSB program operation is performed with respect to a corresponding page, a threshold voltage of the flag cell corresponds to a threshold voltage of the erase state (E). Thus, in the case that the threshold voltage Vth of the flag cell is lower than a VR1 voltage or a VR2 voltage, it may be judged that only LSB program operation is performed on the corresponding page.

Referring to (c) of FIG. 3, in the case that a MSB program operation is performed with respect to a corresponding page, a threshold voltage of the flag cell corresponds to a threshold voltage of the second program state (P2). Thus, in the case that the threshold voltage Vth of the flag cell is higher than VR2 voltage, it may be judged that MSB program operation is performed on the corresponding page.

Figure 4:
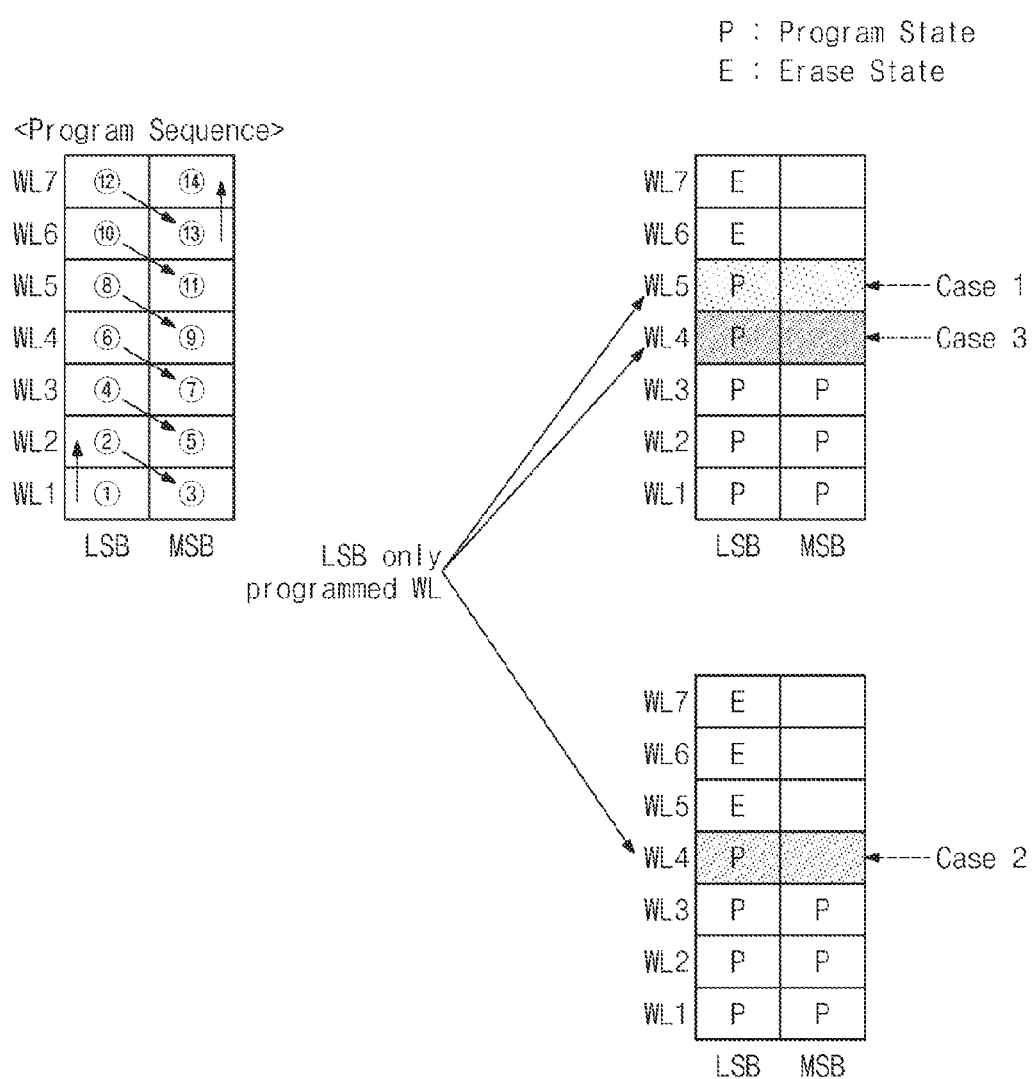
FIG. 4 is a drawing illustrating a program method of a nonvolatile memory device in accordance with the disclosure.

FIG. 4 is a drawing illustrating a program method of a nonvolatile memory device in accordance with the disclosure. Referring to FIG. 4, each word line may store a plurality of pages. For example, each word line may store an LSB page and an MSB page. In the description that follows, it is assumed that each word line stores 2-bit data.

Each page may be programmed in the order of a first page ①, a second page ②, ..., and a fourteenth page ⑭. Thus, a page in which only the LSB is programmed (hereinafter it is referred to as an LSB-only programmed page) may include three cases. In a first case (Case 1), an adjacent lower-order word line is in an LSB-only programmed state, and an adjacent higher-order word line is in an erase state. In a second case (Case 2), an adjacent lower-order word line is in a state that LSB~MSB are programmed and an adjacent higher-order word line is in an erase state. In a third case (Case 3), an adjacent lower-order word line is in a state that LSB~MSB are programmed and an adjacent higher-order word line is in an LSB-only programmed state. In the first through third cases, memory cells are coupling-affected by adjacent cells.

Figure 5:
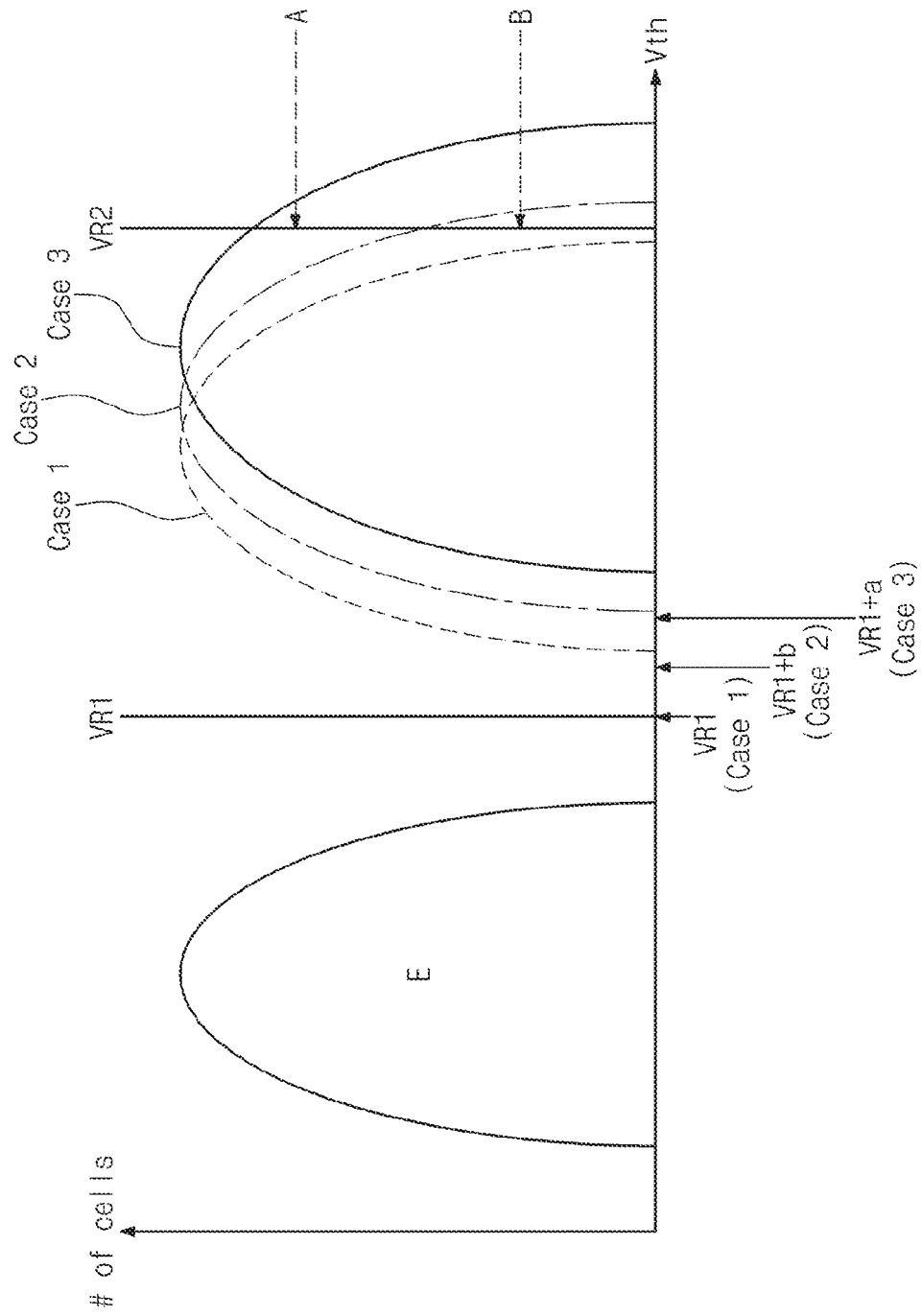
FIG. 5 is a drawing illustrating a threshold voltage distribution with respect to first through third cases (Cases 1, 2 and 3) of FIG. 4.

FIG. 5 is a drawing illustrating a threshold voltage distribution with respect to first through third cases (Cases 1, 2 and 3) of FIG. 4. Referring to FIG. 5, a distribution of the second case (Case 2) is located away from a VR1 compared with the first case (Case 1). A distribution of the third case (Case 3) is located away from VR1 compared with the second case (Case 2). Thus, in a read operation, it is necessary to change a select read voltage.

In the first case (Case 1), an adjacent lower-order word line is in an LSB-only programmed state, and an adjacent higher-order word line is in an erase state. Thus, among the first through third cases (Cases 1, 2 and 3), the first case (Case 1) may be least coupling-affected by adjacent cells. For example, a threshold voltage distribution of the first case (Case 1) may maintain a state lower than VR2.

In the third case (Case 3), an adjacent lower-order word line is in a state that LSB~MSB are programmed and an adjacent higher-order word line is in an LSB-only programmed state. Thus, among the first through third cases (Cases 1, 2 and 3), the third case (Case 3) may be most coupling-affected by adjacent cells. For example, a threshold voltage distribution of the third case (Case 3) may include a portion higher than VR2.

In the second case (Case 2), an adjacent lower-order word line is in a state that LSB~MSB are programmed and an adjacent higher-order word line is in an erase state. Thus, among the first through third cases (Cases 1, 2 and 3), the second case (Case 2) may be more coupling-affected by adjacent cells compared with the first case (Case 1) and may be less coupling-affected by adjacent cells compared with the third case (Case 3). For example, a threshold voltage distribution of the second case (Case 2) may be located between the threshold voltage distribution of the first case (Case 1) and the threshold voltage distribution of the third case (Case 3). The threshold voltage distribution of the second case (Case 2) may include a portion higher than VR2. However, the portion higher than VR2 in the second case (Case 2) may be smaller than the portion higher than VR2 in the third case (Case 3).

Thus, the nonvolatile memory device 100 (refer to FIG. 1) may apply VR2 to a selected word line to determine the first through third cases (Case 1, 2 and 3). The nonvolatile memory device 100 may apply VR2 to a selected word line to detect a fail bit. The nonvolatile memory device 100 may compare the number of detected fail bits with predetermined reference values A and B. According to a comparison result, the nonvolatile memory device 100 can determine the first through third cases (Case 1, 2 and 3).

For example, by the comparison result, if the number of detected fail bits is greater than the reference value A, the nonvolatile memory device 100 may judge the word line state as the third case (Case 3). By the comparison result, if the number of detected fail bits is smaller than the reference value B, the nonvolatile memory device 100 may judge the word line state as the first case (Case 1). By the comparison result, if the number of detected fail bits is greater than the reference value B and smaller than the reference value A, the nonvolatile memory device 100 may judge the word line state as the second case (Case 2).

The nonvolatile memory device 100, in an LSB program page, may change a select read voltage for distinguishing the erase state (E) and the initial program state (P0) depending on the comparison result. For example, in the first case (Case 1), the nonvolatile memory device 100 may apply VR1 as the select read voltage. In the second case (Case 2), the nonvolatile memory device 100 may apply VR1+b as the select read voltage. In the third case (Case 3), the nonvolatile memory device 100 may apply VR1+a as the select read voltage. Thus, in a read operation of the LSB program page, the nonvolatile memory device 100 may apply different select read voltages depending on the first through third cases (Cases 1, 2 and 3). The nonvolatile memory device 100 can improve reliability in a read operation of the LSB program page.

FIG. 6 is a table illustrating a read voltage according to an embodiment of the disclosure. Referring to FIG. 6, the nonvolatile memory device 100 may change a select read voltage or an unselect read voltage being applied to a word line adjacent to a selected word line. A first case (Case 1) of FIG. 6 corresponds to the first case (Case 1) of FIG. 5. A second case (Case 2) of FIG. 6 corresponds to the second case (Case 2) of FIG. 5. A third case (Case 3) of FIG. 6 corresponds to the third case (Case 3) of FIG. 5.

In the first case (Case 1), a selected word line is a fifth word line WL5. In the first case (Case 1), a select read voltage is not changed. For example, a VR1 may be applied to the selected word line. In the first case (Case 1), unselect read voltages of a higher-order word line and a lower-order word line adjacent to the selected word line may be changed. For example, a voltage lower than an unselect read voltage Vread being applied to the remaining word lines may be applied to fourth and sixth word lines WL4 and WL6. Vread-α may be applied to the fourth and sixth word lines WL4 and WL6.

In the second case (Case 2), a selected word line is a fourth word line WL4. In the second case (Case 2), a select read voltage may increase. For example, VR1+b may be applied to the fourth word line WL4. In the second case (Case 2), an unselect read voltage of a higher-order word line adjacent to the selected word line may decrease. For example, Vread-α may be applied to the fifth word line WL5.

In the third case (Case 3), a selected word line is a fourth word line WL4. In the third case (Case 3), a select read voltage may increase. For example, a VR1+a may be applied to the fourth word line WL4. In the third case (Case 3), an unselect read voltage of a higher-order word line adjacent to the selected word line may decrease. For example, Vread-α may be applied to the fifth word line WL5.

Figure 7:
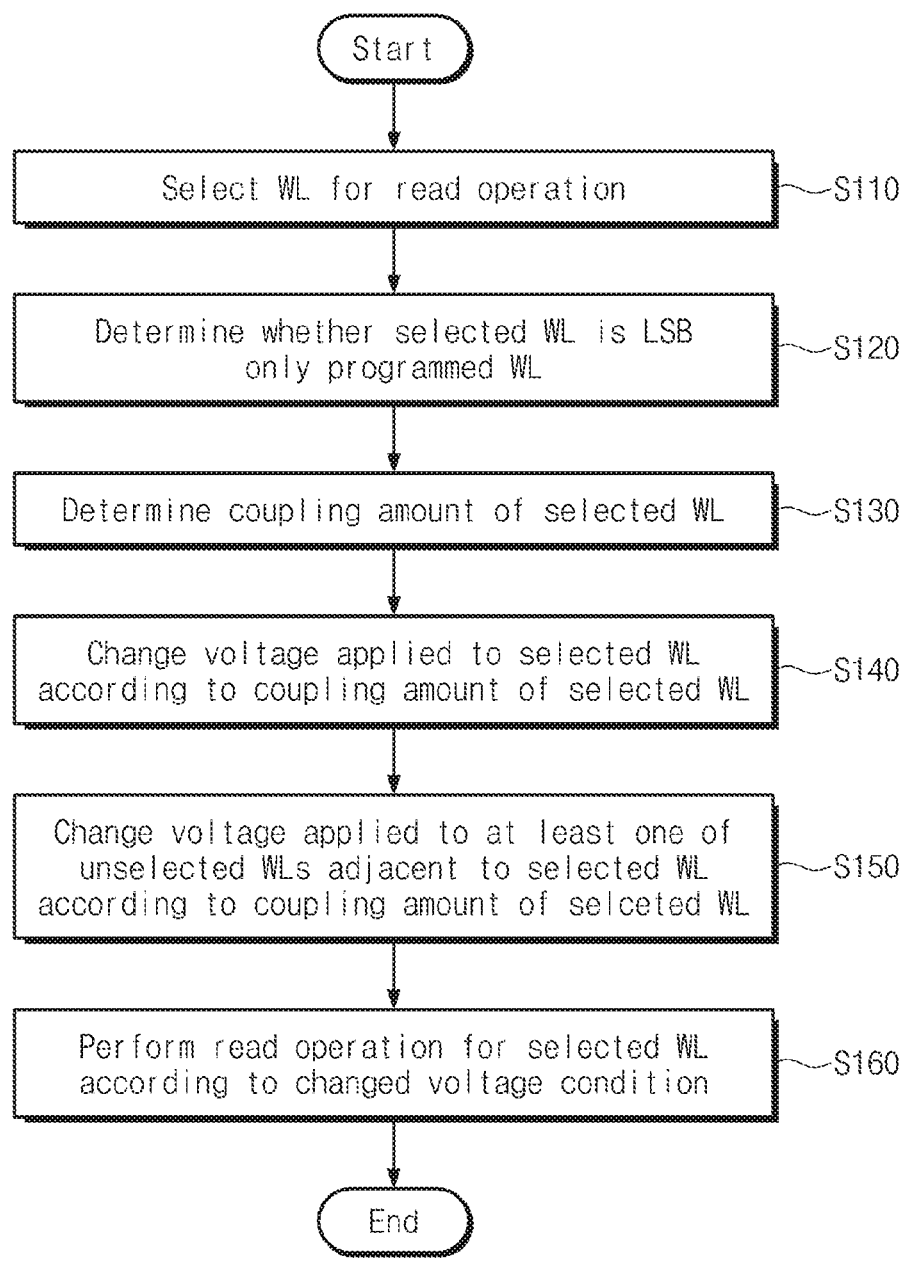
FIG. 7 is a flow chart illustrating a read method of a nonvolatile memory device in accordance with an embodiment of the disclosure.

FIG. 7 is a flow chart illustrating a read method of a nonvolatile memory device in accordance with an embodiment of the disclosure. Referring to FIGS. 1, 5 and 7, the nonvolatile memory device 100 can measure a coupling amount of an LSB-only programmed page. The nonvolatile memory device 100 can apply changed select and unselect read voltages according to the measured coupling amounts to perform a read operation of a selected word line.

In a step S110, the nonvolatile memory device 100 may select a word line WL for performing a read operation. In the case that the selected word line is an LSB-only programmed page, the nonvolatile memory device 100 may perform steps S120 through S150 below before performing a read operation of the selected word line to improve reliability.

In the step S120, the nonvolatile memory device 100 can determine whether only an LSB is programmed in the selected word line. For example, the nonvolatile memory device 100 may apply VR2 described in FIG. 5 to the selected word line. The nonvolatile memory device 100 can check a state of a flag cell included in the selected word line. In the case that the flag cell is an off-cell, the selected word line is in a state that an MSB program is completed. In the case that the flag cell is an on-cell, the selected word line is in an erase state or an LSB-programmed state.

In a step S130, in the case that the selected word line is not in an MSB-programmed state, the nonvolatile memory device 100 can detect a coupling amount of the selected word line. For example, the nonvolatile memory device 100 may apply VR2 to the selected word line. The nonvolatile memory device 100 can measure the number of fail bits of the selected word line. The nonvolatile memory device 100 may compare the number of measured fail bits with predetermined reference values. If the number of measured fail bits is greater than the reference value A described in FIG. 5, the nonvolatile memory device 100 may judge a state of the selected word line as the third case (Case 3) of FIG. 5. If the number of measured fail bits is smaller than the reference value B described in FIG. 5, the nonvolatile memory device 100 may judge a state of the selected word line as the first case (Case 1) of FIG. 5. If the number of measured fail bits is greater than the reference value B and smaller than the reference value A, the nonvolatile memory device 100 may judge a state of the selected word line as the second case (Case 2) of FIG. 5.

In a step S140, the nonvolatile memory device 100 may change a select read voltage being applied to the selected word line according to a coupling amount. For example, the nonvolatile memory device 100 may change a select read voltage for distinguishing the erase state (E) and the initial program state (P0) described in FIG. 5 according to the first through third cases (Cases 1, 2 and 3). The nonvolatile memory device 100, in the first case (Case 1), may apply VR1 as the select read voltage. The nonvolatile memory device 100, in the second case (Case 2), may apply VR1+b as the select read voltage. The nonvolatile memory device 100, in the third case (Case 3), may apply VR1+a as the select read voltage.

In a step S150, the nonvolatile memory device 100 may change an unselect read voltage being applied to a word line adjacent to the selected word line according to a coupling amount. For example, the nonvolatile memory device 100, in the first case (Case 1), may apply Vread-α to a higher-order word line and a lower-order word line adjacent to the selected word line as an unselect read voltage. The nonvolatile memory device 100, in the second case (Case 2), may apply Vread-α to a higher-order word line adjacent to the selected word line as an unselect read voltage. The nonvolatile memory device 100, in the third case (Case 3), may apply Vread-α to a higher-order word line adjacent to the selected word line as an unselect read voltage. The nonvolatile memory device 100 may apply Vread to the remaining unselected word lines as an unselect read voltage.

In a step S160, the nonvolatile memory device 100 may perform a read operation according to a changed voltage condition. For example, the nonvolatile memory device 100 may apply select and unselect read voltages described in the steps S140 and S150 according to the first through third cases (Cases 1, 2 and 3) to perform a read operation of the selected word line.

Figure 8:
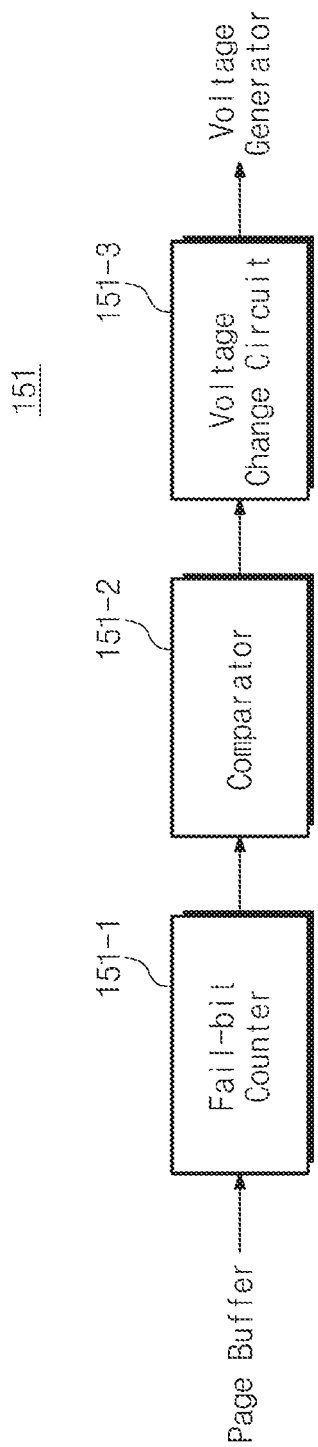
FIG. 8 is a block diagram illustrating a coupling amount detector of FIG. 1 in detail.

FIG. 8 is a block diagram illustrating a coupling amount detector of FIG. 1 in detail. Referring to FIGS. 1 and 8, the coupling amount detector 151 may include a fail bit counter 151-1, a comparator 151-2 and a voltage change circuit 151-3. The nonvolatile memory device 100 can determine whether only an LSB is programmed in a selected word line. In the case that only the LSB is programmed in the selected word line, the nonvolatile memory device 100 may perform a preliminary read operation to detect a coupling amount of the selected word line.

The fail bit counter 151-1 may receive a preliminary read result of the selected word line from the page buffer circuit 140. For example, the nonvolatile memory device 100 may apply VR2 to the selected word line to perform the preliminary read operation for transmitting the number of fail bits to the fail bit counter 151-1. The fail bit counter 151-1 can receive a result of the preliminary read operation to measure the number of fail bits. For example, the fail bit counter 151-1 can count a case of an off-cell as a fail bit according to the result of the preliminary read operation.

The comparator 151-2 may receive the number of fail bits measured by the fail bit counter 151-1. The comparator 151-2 can compare the number of fail bits with a predetermined reference value. For example, the comparator 151-2 may compare the number of fail bits with A and B described in FIG. 5. In the case that the number of fail bits is greater than A, the comparator 151-2 may judge the word line state as the third case (Case 3). In the case that the number of fail bits is smaller than B, the comparator 151-2 may judge the word line state as the first case (Case 1). In the case that the number of fail bits is greater than B and smaller than A, the comparator 151-2 may judge the word line state as the second case (Case 2).

The voltage change circuit 151-3 may receive the comparison result from the comparator 151-2. The voltage change circuit 151-3 may control the voltage generator 130 to supply changed select and unselect read voltages according to the received comparison result to the address decoder 120. For example, the voltage change circuit 151-3 may control the voltage generator 130 to supply the changed select and unselect read voltages to a selected word line and word lines adjacent to the selected word line according to the first through third cases (Case 1, 2 and 3).

For example, the voltage change circuit 151-3, in the case of the first case (Case 1), may control the voltage generator 130 to apply VR1 as a select read voltage. The voltage change circuit 151-3, in the case of the second case (Case 2), may control the voltage generator 130 to apply VR1+b as a select read voltage. In voltage change circuit 151-3, in the case of the third case (Case 3), may control the voltage generator 130 to apply VR1+a as a select read voltage.

For example, the voltage change circuit 151-3, in the first case (Case 1), may control the voltage generator 130 to apply Vread-α to a higher-order word line and a lower-order word line adjacent to the selected word line as an unselect read voltage. The voltage change circuit 151-3, in the second case (Case 2), may control the voltage generator 130 to apply Vread-α to a higher-order word line adjacent to the selected word line as an unselect read voltage. The voltage change circuit 151-3, in the third case (Case 3), may control the voltage generator 130 to apply Vread-α to a higher-order word line adjacent to the selected word line as an unselect read voltage.

The nonvolatile memory device 100 may judge where the selected word line corresponds among the first through third cases (Cases 1, 2 and 3) through the coupling amount detector 151. According to the judgment result, the nonvolatile memory device 100 may change voltages being applied to a selected word line and word lines adjacent to the selected word line in a read operation. Thus, in a read operation of an LSB-only programmed page, the nonvolatile memory device 100 can improve reliability.

Figure 9:
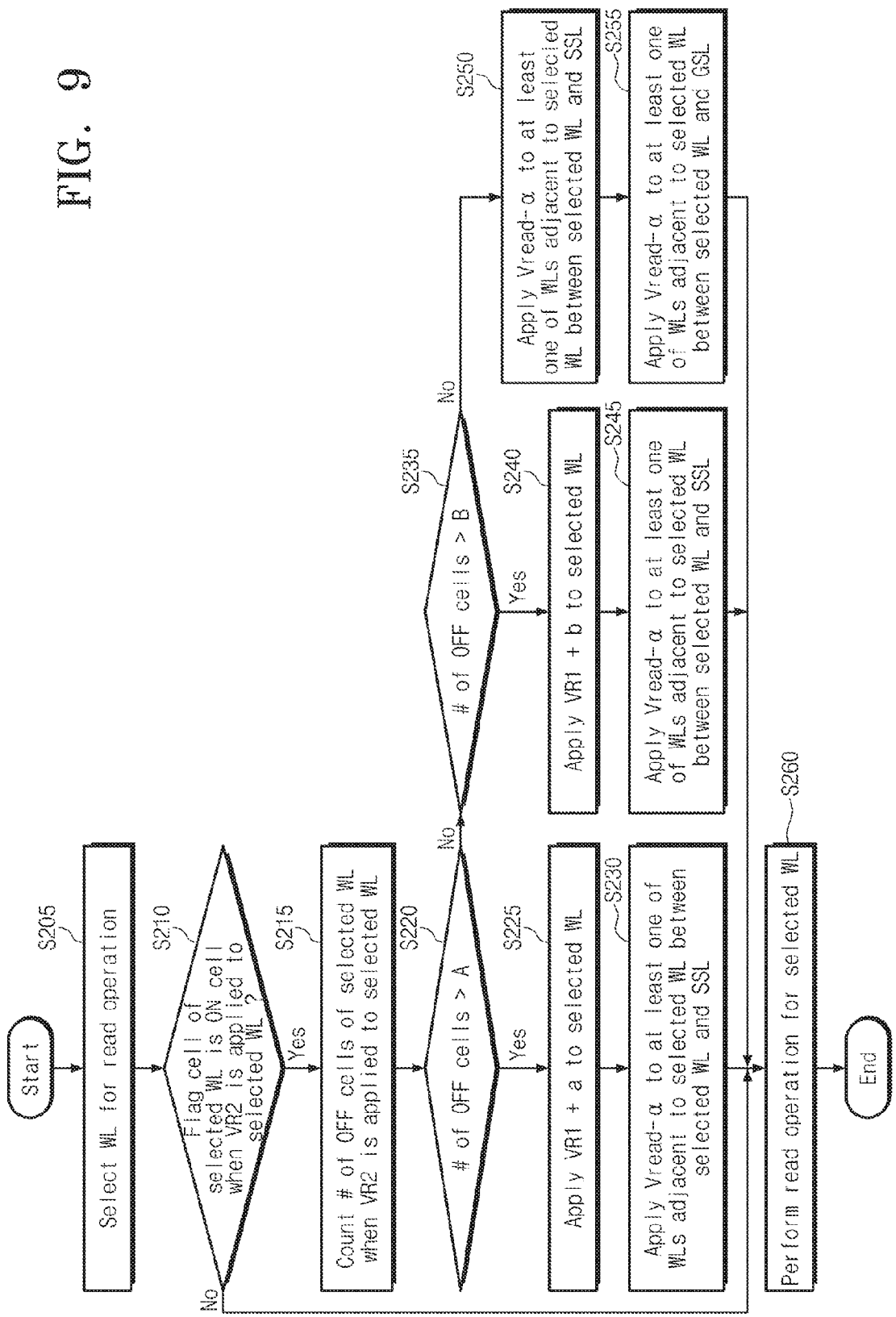
FIG. 9 is a flow chart illustrating a read operation of a nonvolatile memory device in accordance with another embodiment of the disclosure.

FIG. 9 is a flow chart illustrating a read operation of a nonvolatile memory device in accordance with another embodiment of the disclosure. Referring to FIGS. 1, 5, 8 and 9, in a read operation of an LSB-only programmed page, the nonvolatile memory device 100 can improve reliability.

In a step S205, the nonvolatile memory device 100 may select a word line for performing a read operation.

In a step S210, in the case of applying VR2 to the selected word line, the nonvolatile memory device 100 can judge whether a flag cell included in the selected word line is an on-cell. In the case that the flag cell is an on-cell, the selected word line may include an LSB-only programmed page. In this case, the procedure goes to a step S215. In the case that the flag cell is an off-cell, the selected word line may include a page in which the LSB~MSB are programmed. In this case, the procedure goes to a step S260.

In the step S215, in the case of applying VR2 to the selected word line, the nonvolatile memory device 100 can count the number of off-cells among main memory cells. For example, when a select read voltage is VR2, the fail bit counter 151-1 may receive a sensing result of the selected word line from the page buffer circuit 140. The fail bit counter 151-1 can count the number of off-cells from the sensing result of the selected word line.

In a step S220, the nonvolatile memory device 100 can compare the number of off-cells with the reference value A. If the number of off-cells is greater than the reference value A, the procedure goes to a step S225. If the number of off-cells is smaller than the reference value A, the procedure goes to a step S235. For example, the comparator 151-2 can compare the number of off-cells with the reference value A. In the case that the number of off-cells is greater than the reference value A, the selected word line may correspond to the third case (Case 3) of FIG. 5.

In the step S225, the nonvolatile memory device 100 may apply VR1+a to the selected word line. For example, in the third case (Case 3), the nonvolatile memory device 100 can change a select read voltage most greatly.

In a step S230, the nonvolatile memory device 100 may apply Vread-α to at least one word line adjacent to a selected word line between the selected word line and a string select line SSL. For example, in the third case (Case 3), the nonvolatile memory device 100 can decrease an unselect read voltage being applied to at least one among higher-order word lines adjacent to the selected word line.

In a step S235, the nonvolatile memory device 100 can compare the number of off-cells with the reference value B. If the number of off-cells is greater than the reference value B, the procedure goes to a step S240. If the number of off-cells is smaller than the reference value B, the procedure goes to a step S250. For example, the comparator 151-2 can compare the number of off-cells with the reference value B. In the case that the number of off-cells is greater than the reference value B and smaller than the reference value A, the selected word line may correspond to the second case (Case 2) of FIG. 5. If the number of off-cells is smaller than the reference value B, the selected word line may correspond to the first case (Case 1) of FIG. 5.

In the step S240, the nonvolatile memory device 100 may apply VR1+b to the selected word line. For example, in the second case (Case 2), the nonvolatile memory device 100 can change a select read voltage between the first case (Case 1) and the third case (Case 3).

In a step S245, the nonvolatile memory device 100 may apply Vread-α to at least one word line adjacent to a selected word line between the selected word line and the string select line SSL. For example, in the second case (Case 2), the nonvolatile memory device 100 can decrease an unselect read voltage being applied to at least one among higher-order word lines adjacent to the selected word line.

In the step S250, the nonvolatile memory device 100 may apply Vread-α to at least one word line adjacent to a selected word line between the selected word line and the string select line SSL. For example, in the first case (Case 1), the nonvolatile memory device 100 can decrease an unselect read voltage being applied to at least one among higher-order word lines adjacent to the selected word line.

In a step S255, the nonvolatile memory device 100 may apply Vread-α to at least one word line adjacent to a selected word line between the selected word line and a ground select line GSL. For example, in the first case (Case 1), the nonvolatile memory device 100 can decrease an unselect read voltage being applied to at least one among not only higher-order word lines adjacent to the selected word but also lower-order word lines adjacent to the selected word line.

In the step S260, the nonvolatile memory device 100 can apply voltages determined through the steps S220 through S255 to word lines WL to perform a read operation of the selected word line. An LSB-only programmed page may be diversely coupling-affected depending on states of peripheral word lines. For example, a threshold voltage distribution of an LSB-only programmed page may have the first through third cases (Cases 1, 2 and 3) described in FIG. 5 depending on states of peripheral word lines. The nonvolatile memory device 100 can adjust voltages being applied to word lines according to the first through third cases (Cases 1, 2 and 3) to perform the read operation of the selected word line. Thus, the nonvolatile memory device 100 can improve reliability in a read operation of an LSB only programmed word line.

Figure 10:
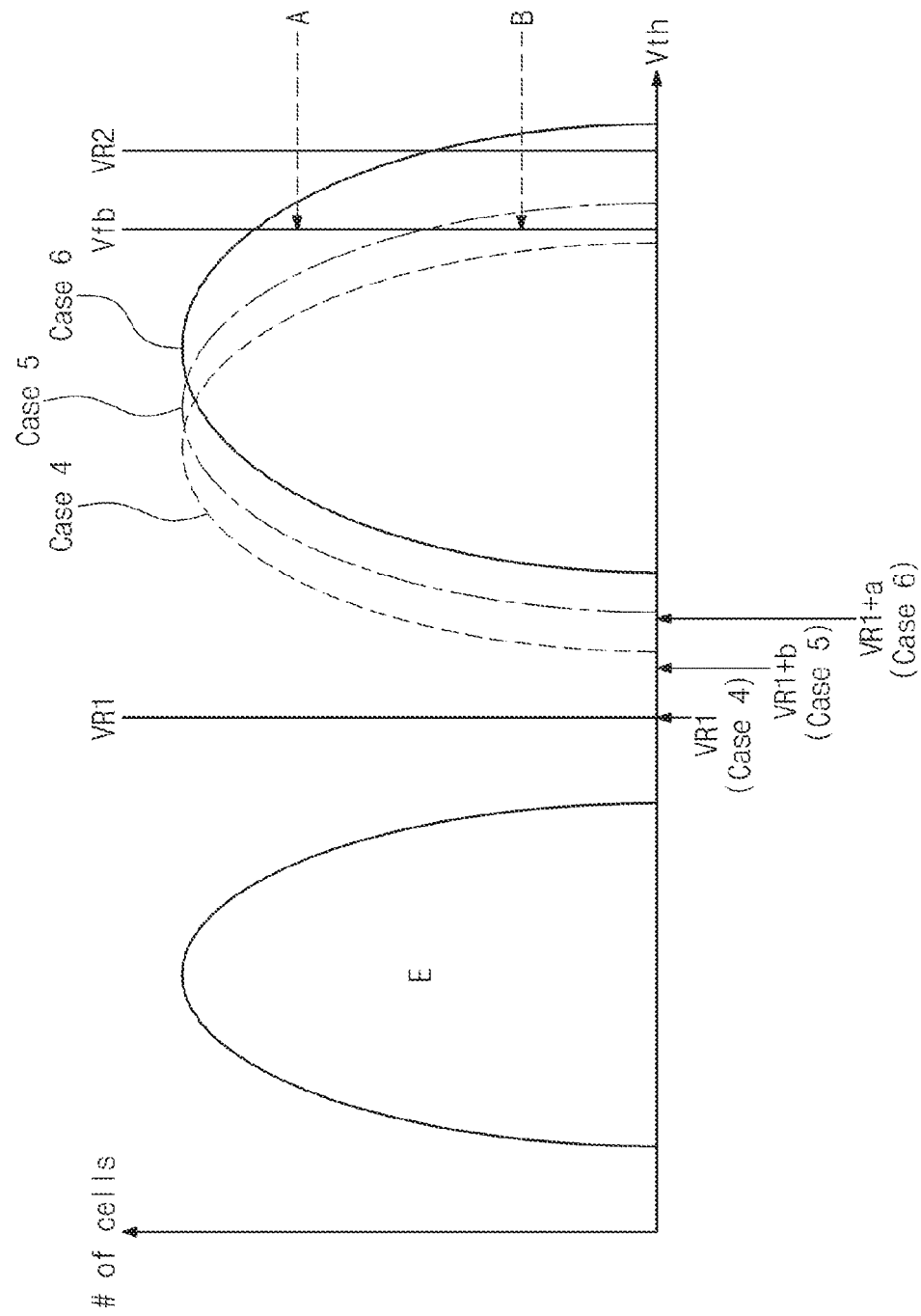
FIG. 10 is a drawing illustrating a threshold voltage distribution with respect to fourth through sixth cases (Cases 4, 5 and 6).

FIG. 10 is a drawing illustrating a threshold voltage distribution with respect to fourth through sixth cases (Cases 4, 5 and 6). Referring to FIG. 10, the nonvolatile memory device 100 can apply a fail bit detection voltage Vfb to detect the number of fail bits. Unlike the threshold voltage distribution of FIG. 5, in a threshold voltage distribution of FIG. 10, only the sixth case (Case 6) meets VR2. Thus, to determine the fourth through sixth cases (Cases 4, 5 and 6) through the reference values A and B in FIG. 10, it is necessary for the nonvolatile memory device 100 to detect the number of fail bits by applying the fail bit detection voltage Vfb to the selected word line.

A process that the threshold voltage distribution of FIG. 10 is formed is similar to the process that the threshold voltage distribution of FIG. 5 is formed. Thus, a description thereof is omitted.

The nonvolatile memory device 100 can determine the fourth through sixth cases (Cases 4, 5 and 6) by applying the fail bit detection voltage Vfb to the selected word line. The nonvolatile memory device 100 applies the fail bit detection voltage Vfb to the selected word line and can detect a fail bit. The nonvolatile memory device 100 can compare the number of detected fail bits with the predetermined reference values A and B. According to a comparison result, the nonvolatile memory device 100 can determine the fourth through sixth cases (Cases 4, 5 and 6).

For example, in the comparison result, if the number of fail bits is greater than the reference value A, the nonvolatile memory device 100 can judge the word line state as the sixth case (Case 6). In the comparison result, if the number of fail bits is smaller than the reference value B, the nonvolatile memory device 100 can judge the word line state as the fourth case (Case 4). In the comparison result, if the number of fail bits is greater than the reference value B and smaller than the reference value A, the nonvolatile memory device 100 can judge the word line state as the fifth case (Case 5).

The nonvolatile memory device 100, in the LSB program page, can change a select read voltage for distinguishing the erase state (E) and the initial program state (P0) according to the comparison result. For example, in the fourth case (Case 4), the nonvolatile memory device 100 may apply VR1 as a select read voltage. In the fifth case (Case 5), the nonvolatile memory device 100 may apply VR1+b as a select read voltage. In the sixth case (Case 6), the nonvolatile memory device 100 may apply VR1+a as a select read voltage. Thus, the nonvolatile memory device 100, in a read operation of an LSB program page, may apply different select read voltage depending on the fourth through sixth cases (Cases 4, 5 and 6). Consequently, the nonvolatile memory device 100 can improve reliability in a read operation of the LSB program page.

FIG. 11 is a table illustrating a read voltage according to another embodiment of the disclosure. Referring to FIG. 11, the nonvolatile memory device 100 may change a select read voltage or an unselect read voltage being applied to a word line adjacent to a selected word line. A fourth case (Case 4) of FIG. 11 corresponds to the fourth case (Case 4) of FIG. 10. A fifth case (Case 5) of FIG. 11 corresponds to the fifth case (Case 5) of FIG. 10. A sixth case (Case 6) of FIG. 11 corresponds to the sixth case (Case 6) of FIG. 10.

In the fourth case (Case 4), a selected word line is a fifth word line WL5. In the fourth case (Case 4), a select read voltage is not changed. For example, a VR1 may be applied to the selected word line. In the fourth case (Case 4), unselect read voltages of a higher-order word line and a lower-order word line adjacent to the selected word line may be changed. For example, a voltage lower than an unselect read voltage Vread being applied to the remaining word lines may be applied to fourth and sixth word lines WL4 and WL6. Vread-β may be applied to the fourth word line WL4. Vread-α may be applied to the sixth word line WL6. That is, different unselect read voltages may be applied to a high-order word line adjacent to the selected word line and a low-order word line adjacent to the selected word line respectively.

In the fifth case (Case 5), a selected word line is a fourth word line WL4. In the fifth case (Case 5), a select read voltage may increase. For example, VR1+b may be applied to the fourth word line WL4. In the fifth case (Case 5), an unselect read voltage of a higher-order word line adjacent to the selected word line may decrease. For example, Vread-α may be applied to the fifth word line WL5.

In the sixth case (Case 6), a selected word line is a fourth word line WL4. In the sixth case (Case 6), a select read voltage may increase. For example, a VR1+a may be applied to the fourth word line WL4. In the sixth case (Case 6), an unselect read voltage of a higher-order word line adjacent to the selected word line may decrease. For example, Vread-α may be applied to the fifth word line WL5.

Figure 12:
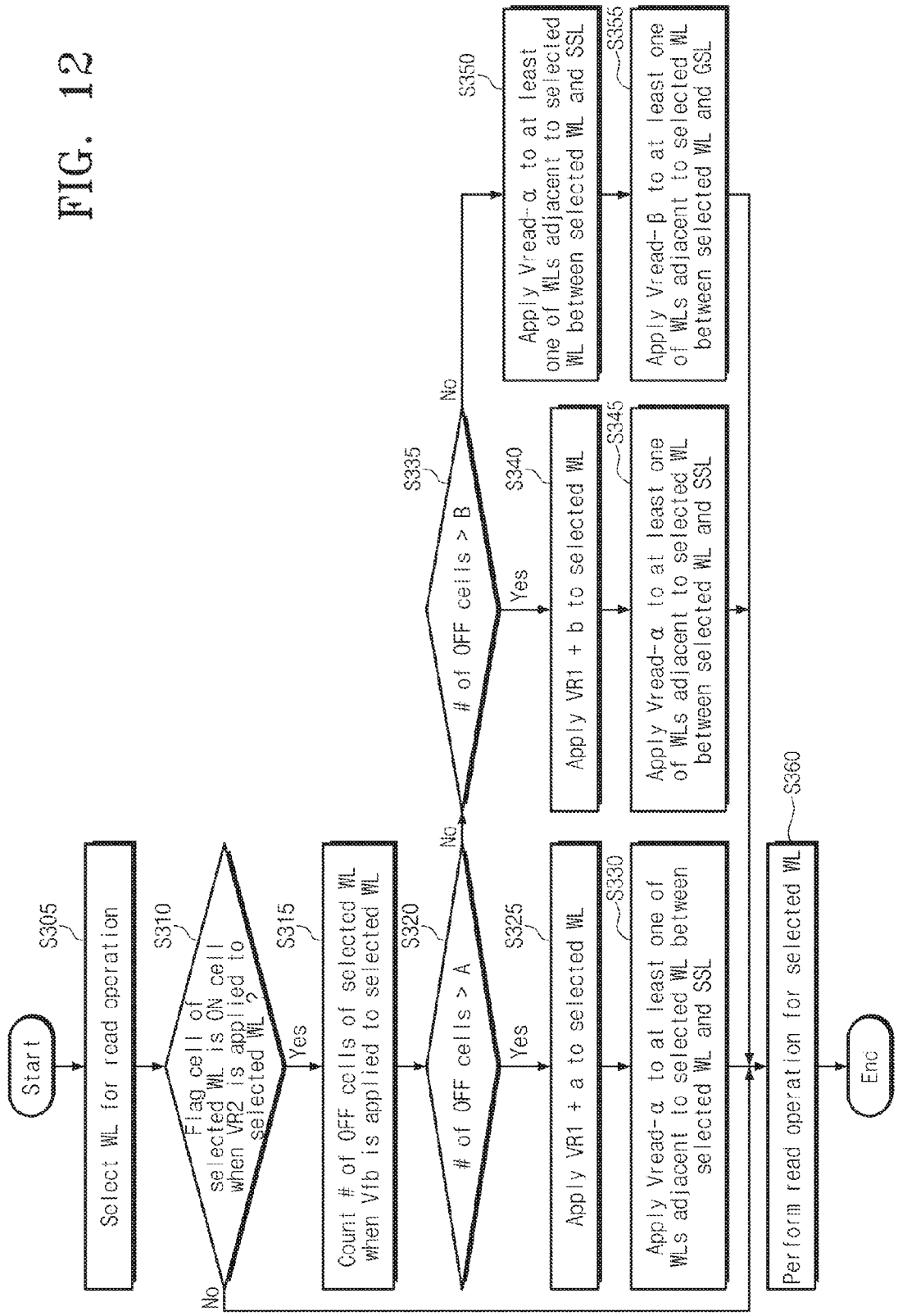
FIG. 12 is a flow chart illustrating a read operation of a nonvolatile memory device in accordance with still another embodiment of the disclosure.

FIG. 12 is a flow chart illustrating a read operation of a nonvolatile memory device in accordance with still another embodiment of the disclosure. Referring to FIGS. 1 and 10 through 12, the nonvolatile memory device 100 can improve reliability in a read operation of LSB-only programmed page.

In a step S305, the nonvolatile memory device 100 can select a word line to perform a read operation.

In a step S310, in the case of applying VR2 to the selected word line, the nonvolatile memory device 100 can judge whether a flag cell included in the selected word line is an on-cell. In the case that the flag cell is an on-cell, the selected word line may include an LSB-only programmed page. In this case, the procedure goes to a step S315. In the case that the flag cell is an off-cell, the selected word line may include a page in which LSB~MSB are programmed. In this case, the procedure goes to a step S360.

In the step S315, in the case of applying a fail bit detection voltage Vfb to the selected word line, the nonvolatile memory device 100 can count the number of off-cells among the main memory cells. For example, the fail bit counter 151-1 can receive a sensing result of the selected word line when the fail bit detection voltage Vfb is applied from the page buffer circuit 140. The fail bit count 151-1 can count the number of off-cells from the sensing result of the selected word line.

In a step S320, the nonvolatile memory device 100 can compare the number of off-cells with a reference value A. If the number of off-cells is greater than the reference value A, the procedure goes to a step S325. If the number of off-cells is smaller than the reference value A, the procedure goes to a step S335. For example, the comparator 151-2 can compare the number of off-cells with a reference value A. If the number of off-cells is greater than the reference value A, the selected word line may correspond to the sixth case (Case 6) of FIG. 10.

In a step S325, the nonvolatile memory device 100 may apply VR1+a to the selected word line. For example, in the sixth case (Case 6), the nonvolatile memory device 100 can change a select read voltage most greatly.

In a step S330, the nonvolatile memory device 100 can apply Vread-α to at least one word line adjacent to a selected word line between the selected word line and a string select line SSL. For example, in the sixth case (Case 6), the nonvolatile memory device 100 can decrease an unselect read voltage being applied to at least one of higher-order word lines adjacent to the selected word line.

In a step S335, the nonvolatile memory device 100 can compare the number of off-cells with the reference value B. If the number of off-cells is greater than the reference value B, the procedure goes to a step S340. If the number of off-cells is smaller than the reference value B, the procedure goes to a step S350. For example, the comparator 151-2 can compare the number of off-cells with the reference value B. If the number of off-cells is greater than the reference value B and smaller than the reference value A, the selected word line may correspond to the fifth case (Case 5) of FIG. 10. If the number of off-cells is smaller than the reference value B, the selected word line may correspond to the fifth case (Case 4) of FIG. 10.

In the step S340, the nonvolatile memory device 100 can apply VR1+b to the selected word line. For example, in the fifth case (Case 5), the nonvolatile memory device 100 can change a select read voltage between the fourth and sixth cases (Cases 4 and 6).

In a step S345, the nonvolatile memory device 100 can apply Vread-α to at least one word line adjacent to a selected word line between the selected word line and the string select line SSL. For example, in the fifth case (Case 5), the nonvolatile memory device 100 can decrease an unselect read voltage being applied to at least one of higher-order word lines adjacent to the selected word line.

In the step S350, the nonvolatile memory device 100 can apply Vread-α to at least one word line adjacent to a selected word line between the selected word line and the string select line SSL. For example, in the fourth case (Case 4), the nonvolatile memory device 100 can decrease an unselect read voltage being applied to at least one of higher-order word lines adjacent to the selected word line.

In a step S355, the nonvolatile memory device 100 can apply Vread-β to at least one word line adjacent to a selected word line between the selected word line and a ground select line GSL. For example, in the fourth case (Case 4), the nonvolatile memory device 100 can decrease an unselect read voltage being applied to at least one among not only higher-order word lines adjacent to the selected word but also lower-order word lines adjacent to the selected word line. Different unselect read voltages may be applied to higher-order word lines adjacent to the selected word and lower-order word lines adjacent to the selected word line respectively.

In a step S360, the nonvolatile memory device 100 can apply voltages determined through the steps S320 through S335 to the word lines WL to perform a read operation of the selected word line. An LSB-only programmed page may be variously coupling-affected depending on a state of peripheral word lines. For example, a threshold voltage distribution of the LSB-only programmed page may have the fourth through sixth cases (Cases 4, 5 and 6) of FIG. 10 depending on a state of peripheral word lines. The nonvolatile memory device 100 can perform a read operation of the selected word line by adjusting voltages being applied to word lines according to fourth through sixth cases (Cases 4, 5 and 6). The nonvolatile memory device 100 can improve reliability in a read operation of LSB only programmed word line.

Figure 13:
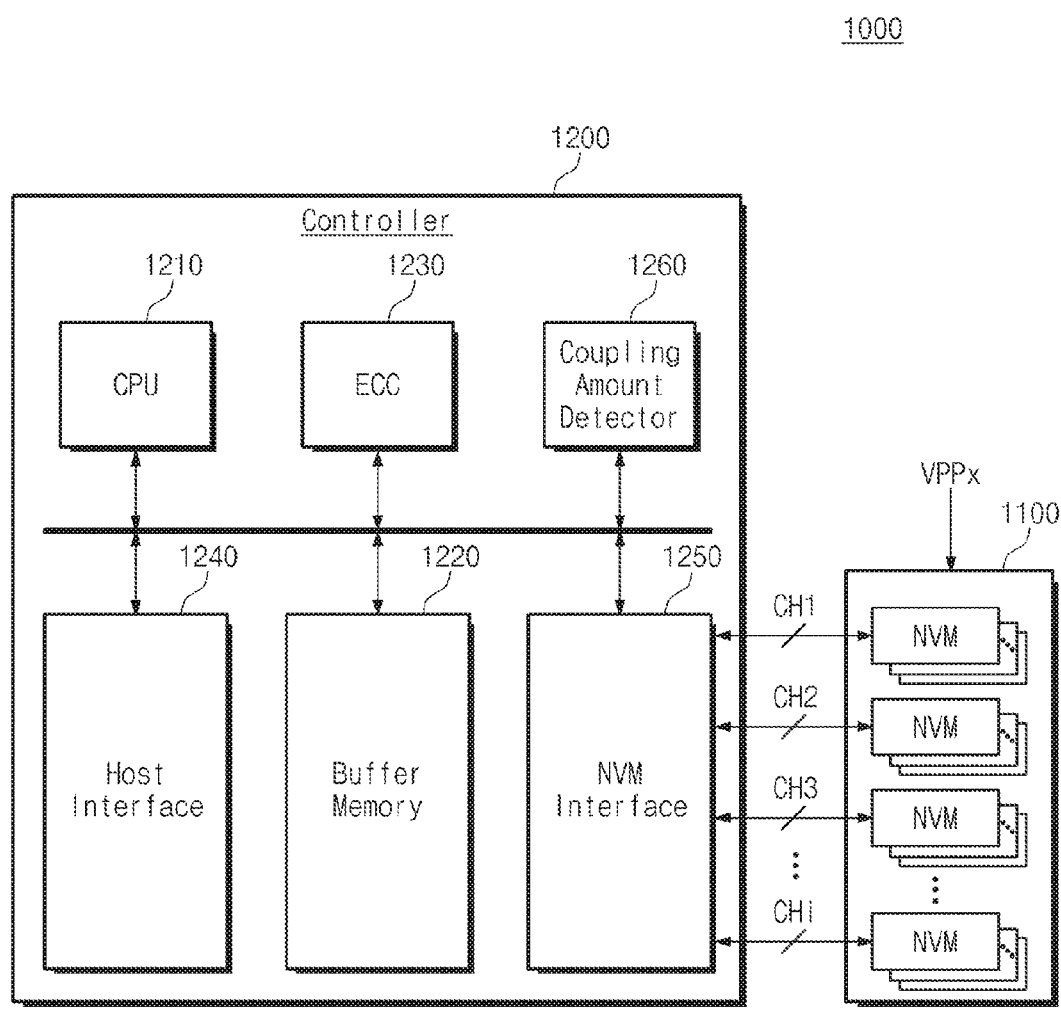
FIG. 13 is a block diagram illustrating a SSD in accordance with an embodiment of the disclosure.

FIG. 13 is a block diagram illustrating a SSD in accordance with an embodiment of the disclosure. Referring to FIG. 13, the SSD 1000 may include a plurality of nonvolatile memory devices 1100 and a SSD controller 1200.

The nonvolatile memory devices 1100 may be embodied to selectively receive an external high voltage Vpp. Each of the nonvolatile memory devices 1100 can reduce a coupling effect in a read operation of the LSB-only programmed page as described in FIGS. 1 through 12.

The SSD controller 1200 is connected to the nonvolatile memory devices 1100 through a plurality of channels CH1~Chi (i is an integer which is two or more). The SSD controller 1200 may include at least one processor 1210, a buffer memory 1220, an error correction circuit 1230, a host interface 1240, a nonvolatile memory interface 1250, and a coupling amount detector 1260.

The buffer memory 1220 temporarily stores data needed to drive the memory controller 1200. The buffer memory 1220 may include a plurality of memory lines storing data or commands.

The error correction circuit 1230 can calculate an error correction code value of data to be programmed in a write operation, correct an error of data read in a read operation based on an error correction code value, and correct an error of data restored from the nonvolatile memory device 1100 in a data restoration operation. Although not illustrated, a code memory, storing code data needed to drive the memory controller 1200, may be further included. The code memory may be embodied by a nonvolatile memory device.

The host interface 1240 may provide an interface function with an external device. The host interface 1240 may be a NAND interface. The nonvolatile memory interface 1250 may provide an interface function with the nonvolatile memory device 1100.

The coupling amount detector 1260 can detect a coupling amount in a read voltage applied in a read operation. For example, the coupling amount detector 1260 can count the number of fail bits in the applied read voltage. The coupling amount detector 1260 can compare the number of fail bits with a reference value to change a voltage to be applied to a selected word line. The coupling amount detector 1260 can also compare the number of fail bits with a reference value to change an unselect read voltage being applied to at least one word line adjacent to the selected word line.

The disclosure may be applied to an eMMC (embedded multimedia card, moviNAND, iNAND).

Figure 14:
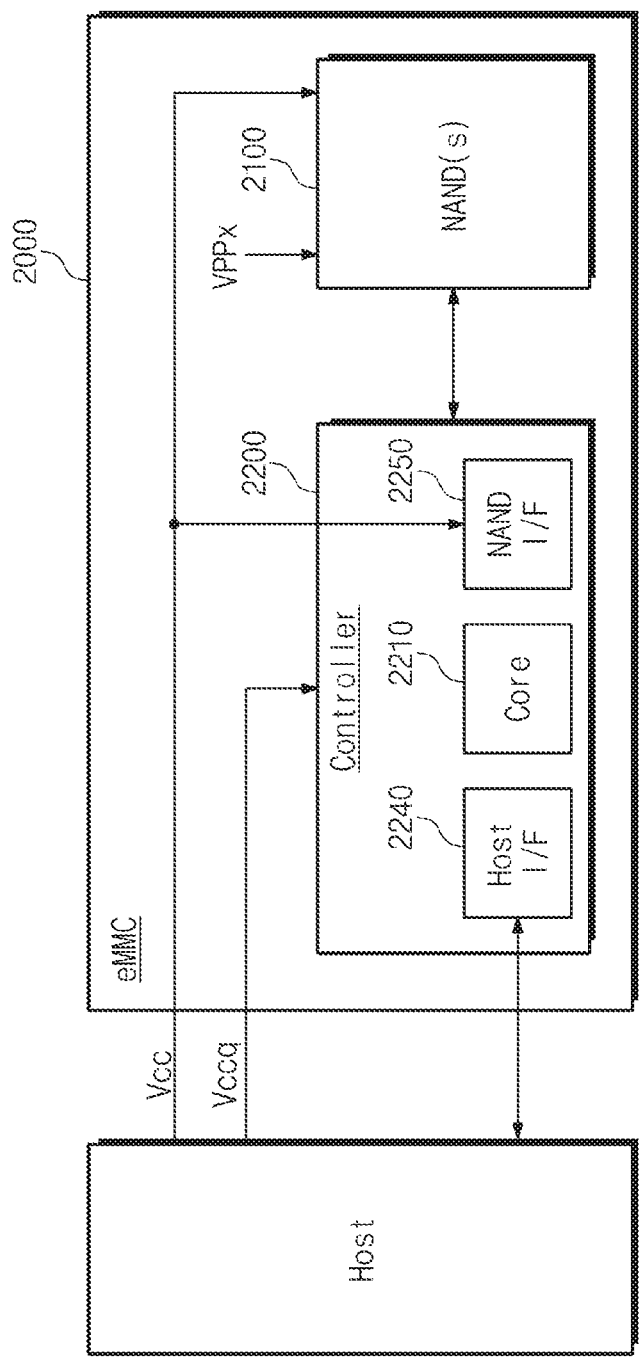
FIG. 14 is a block diagram illustrating an eMMC in accordance with an embodiment of the disclosure.

FIG. 14 is a block diagram illustrating an eMMC in accordance with an embodiment of the disclosure. Referring to FIG. 14, eMMC 2000 may include at least one NAND flash memory device 2100 and a controller 2200.

The NAND flash memory device 2100 may be an SDR (single data rate) NAND or a DDR (double data rate) NAND. The NAND flash memory device 2100 may also be a vertical NAND flash memory device (VNAND). The NAND flash memory device 2100 can reduce a coupling effect in a read operation of the LSB-only programmed page as described in FIGS. 1 through 12.

The controller 2200 may be connected to the NAND flash memory device 2100 through a plurality of channels. The controller 2200 may include at least one controller core 2210, a host interface 2240 and a NAND interface 2250. The controller core 2210 can control an overall operation of the eMMC 2000. The host interface 2240 can perform an interface between a host and the controller core 2210. The NAND interface 2250 performs an interface between the NAND flash memory device 2100 and the controller 2200. The host interface 2240 may be a parallel interface (for example, a MMC interface). The host interface 2240 may be a serial interface (for example, UHS-II, UFS interface).

The eMMC 2000 may be provided with power supply voltages from the host. A first power supply voltage Vcc (for example, 3.3V) may be provided to the NAND flash memory device 2100 and the NAND interface 2250. A second power supply voltage Vccq (for example, 1.8V/3.3V) may be provided to the controller 2200. The eMMC 2000 may be selectively provided with an external high voltage Vpp.

The disclosure may be applied to a UFS (universal flash storage) system.

Figure 15:
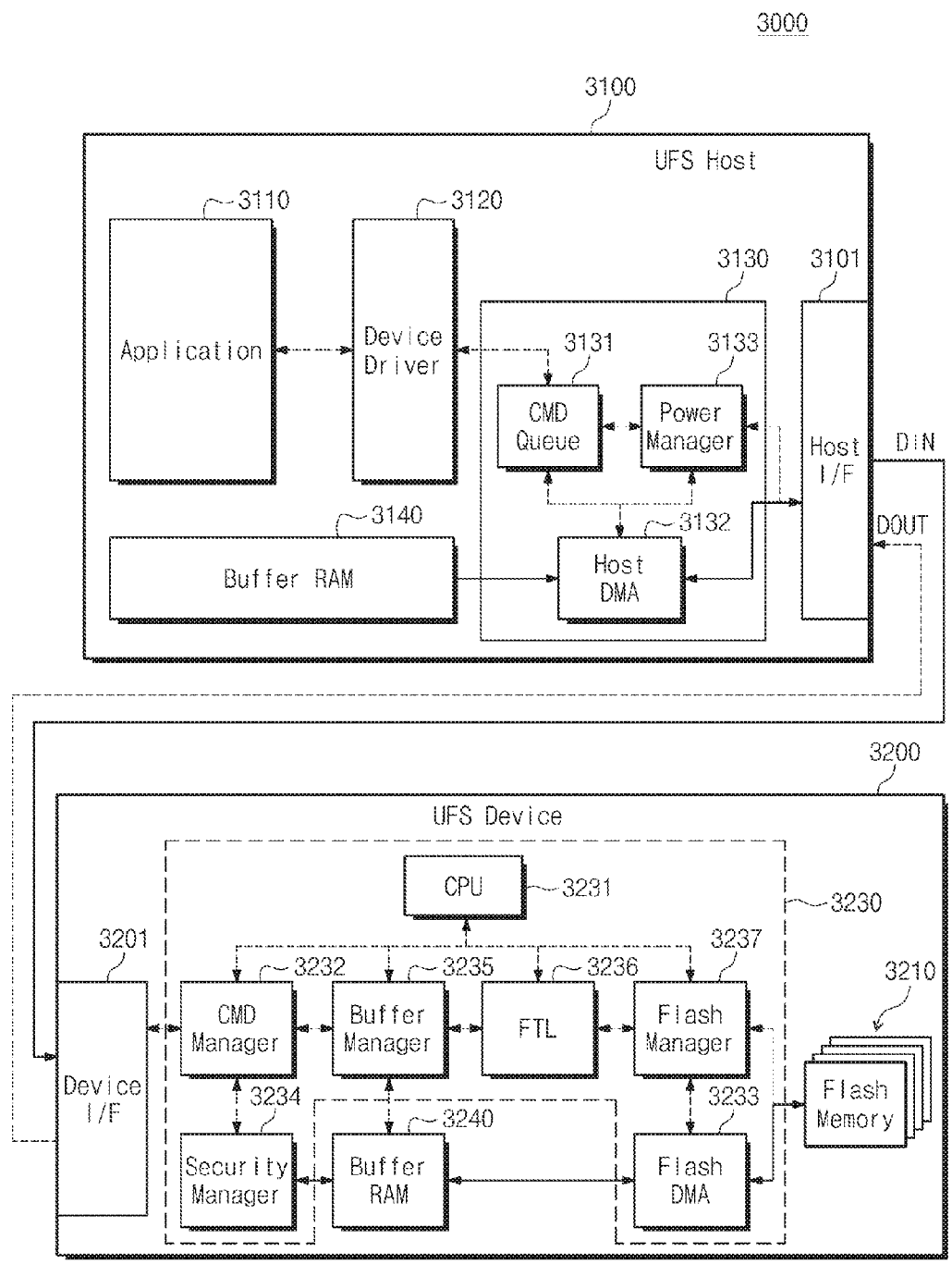
FIG. 15 is a block diagram illustrating a UFS system in accordance with an embodiment of the disclosure.

FIG. 15 is a block diagram illustrating a UFS (universal flash storage) system in accordance with an embodiment of the disclosure. Referring to FIG. 15, the UFS system 3000 may include a UFS host 3100 and a UFS device 3200.

The UFS host 3100 may include an application 3110, a device driver 3120, a host controller 3130, and a buffer RAM 3140. The host controller 3130 may include a command queue 3131, a host DMA 3132 and a power manager 3133. The command queue 3131, the host DMA 3132 and the power manager 3133 may operate in the host controller 3130 in algorithm, software, or firmware.

A command (for example, a write command) generated from the application 3110 and the device driver 3120 of the UFS host 3100 may be input into the command queue 3131 of the host controller 3130. The command queue 3131 can sequentially store commands to be provided to the UFS device 3200. The commands stored in the command queue 3131 may be provided to the host DMA 3132. The host DMA 3132 transmits the commands to the UFS device 3200 through a host interface 3101.

The UFS device 3200 may include a flash memory device 3210, a device controller 3230 and a buffer RAM 3240. The device controller 3230 may include a CPU (central processing unit) 3231, a CMD (command) manager 3232, a flash DMA 3233, a security manager 3234, a buffer manager 3235, a FTL (flash translation layer) 3236 and a flash manager 3237. The CMD (command) manager 3232, the security manager 3234, the buffer manager 3235, the FTL (flash translation layer) 3236 and the flash manager 3237 may operate in the device controller 3230 in algorithm, software, or firmware.

The flash memory 3210 can reduce a coupling effect in a read operation of the LSB-only programmed page as described in FIGS. 1 through 12.

A command input into the UFS device 3200 from the UFS host 3100 may be provided to the command manager 3232 through a device interface 3201. The command manager 3232 analyzes the command provided from the UFS host 3100 and can certify an inputted command using the security manager 3234. The command manager 3232 can allocate the buffer RAM 3240 to receive data through the buffer manager 3235. If preparation for a data transmission is completed, the command manager 3232 transmits a RTT (ready_to_transfer) UPIU to the UFS host 3100.

The UFS host 3100 can transmit data to the UFS device 3200 in response to the RTT (ready_to_transfer) UPIU. The data can be transmitted to the UFS device 3200 through the host DMA 3132 and the host interface 3101. The UFS device 3200 can store received data in the buffer RAM 3240 through the buffer manager 3235. Data stored in the buffer RAM 3240 may be provided to the flash manager 3237 through the flash DMA 3233. The flash manager 3237 can store data in a selected address of the flash memory 3210 with reference to address mapping information of the FTL (flash translation layer) 3236.

If a data transmission and a data program necessary for a command are completed, the UFS device 3200 sends a response signal notifying a completion of a command to the UFS host 3100 through an interface. The UFS host 3100 can notify the device driver 3120 and the application 3110 of whether the command corresponding to the response signal is completed and can finish an operation with respect to the corresponding command.

The disclosure is applicable to a mobile device.

Figure 16:
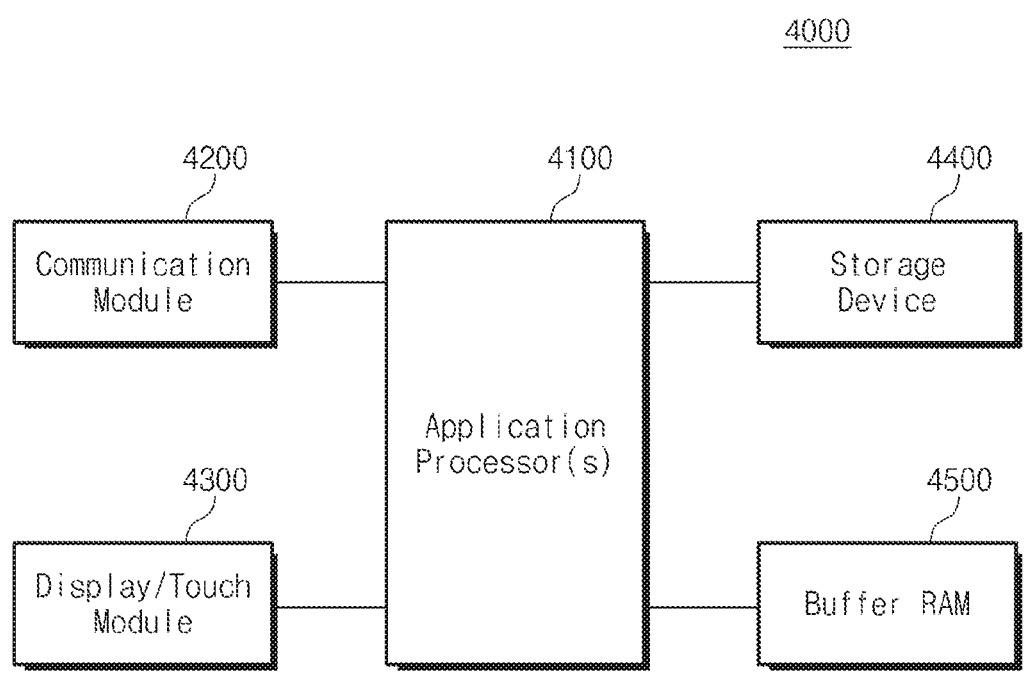
FIG. 16 is a block diagram illustrating a mobile device in accordance with an embodiment of the disclosure.

FIG. 16 is a block diagram illustrating a mobile device in accordance with an embodiment of the disclosure. Referring to FIG. 16, the mobile device 4000 may include an application processor 4100, a communication module 4200, a display/touch module 4300, a storage device 4400 and a buffer RAM 4500.

The application processor 4100 can control an overall operation of the mobile device 4000. The communication module 4200 is configured to control a wired/wireless communication with the outside. The display/touch module 4300 may be configured to display data processed by the application processor 4100 or receive data from a touch panel. The storage device 4400 is configured to store data of a user. The storage device 4400 may be an eMMC, SSD, or UFS device. The buffer RAM 4500 may be configured to temporarily store data needed in an operation of processing the mobile device 4000.

The storage device 4400 can reduce a coupling effect in a read operation of the LSB-only programmed page as described in FIGS. 1 through 12.

The memory system or the storage device in accordance with the embodiments of the disclosure may be mounted using a variety of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (S SOP), thin small outline (TSOP), thin quad flatpack (TQFP), system in package (SIP), multi chip package (MCP), wafer-level fabricated package (WFP) and wafer-level processed stack package (WSP).

According to some embodiments of the disclosure, a nonvolatile memory device controls a select read voltage according to a state of a selected word line and a method of reading the same.

The foregoing is illustrative of the disclosure and is not to be construed as limiting thereof. Although a few embodiments of the disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. The present disclosure is defined by the following claims, with equivalents of the claims to be included therein

What is claimed is:

1. A method, executed by a memory controller, of reading data stored by memory cells of a nonvolatile memory device addressed by a selected word line, the method comprising:
    reading a flag bit value stored by a first memory cell addressed by the selected word line;
    identifying the selected word line as least-significant bit (LSB) programmed when the flag bit has a first value and identifying the selected word line as most-significant bit (MSB) programmed when the flag bit has a second value differing from the first value;
    applying a first read voltage to the selected word line to identify, as the number of failed-read cells, the number of memory cells addressed by the selected word line storing a voltage exceeding the first read voltage; and
    applying a second read voltage to the selected word line to perform a read operation of the memory cells addressed by the selected word line, wherein:
    the second read voltage exceeds a third read voltage by a first amount when the identified number of failed-read cells exceeds a first threshold number and the selected word line is identified as LSB programmed,
    the third read voltage has a level for distinguishing, for each of the memory cells, an erase state from a program state adjacent to the erase state, and
    the selected word line is LSB programmed when all memory cells addressed by the selected word line are programmed to store no more than one bit of data and the selected word line is MSB programmed when a memory cell addressed by the selected word line, other than the first memory cell, is programmed to store more than one bit of data.

2. The method of claim 1, wherein the second read voltage exceeds the third read voltage by a second amount, which is less than the first amount, when the identified number of failed-read cells exceeds a second threshold number, but does not exceed the first threshold number, and the selected word line is identified as LSB programmed.

3. The method of claim 1, wherein the second read voltage equals the third read voltage when the identified number of failed-read cells does not exceed the first threshold number and the selected word line is identified as LSB programmed.

4. The method of claim 1, further comprising:
    applying a first unselect voltage to a first word line, which differs from the selected word line, disposed along a bit line between a string select line and a ground select line during the read operation of the memory cells addressed by the selected word line; and
    applying a second unselect voltage to a second word line, which differs from both the selected word line and the first word line, disposed along the bit line between the string select line and the ground select line during the read operation of the memory cells addressed by the selected word line, wherein:
    the first and second unselect voltages are different voltages, and
    each of the selected word line, first word line, second word line, string select line, and ground select line is electrically connected to the bit line through a memory cell or switch.

5. The method of claim 4, wherein:
    the first word line is disposed adjacent to the selected word line along the bit line between the selected word line and the string select line, and
    the first unselect voltage is less than the second unselect voltage.

6. A read method of a nonvolatile memory device, the method comprising:
    determining whether a selected word line comprises LSB (least significant bit) page only programmed memory cells by applying a first read voltage to the selected word line;
    in the case that the selected word line comprises LSB page only programmed memory cells, counting the number of off-cells by applying the first read voltage to the selected word line; and
    in a read operation, changing a select read voltage being applied to the selected word line according to the number of off-cells.

7. The read method of a nonvolatile memory device of claim 6, further comprising changing a first unselect read voltage being applied to at least one word line adjacent to the selected word line between the selected word line and a string select line according to the number of off-cells.

8. The read method of a nonvolatile memory device of claim 7, wherein a second unselect read voltage being applied to at least one word line adjacent to the selected word line between the selected word line and a ground select line is changed according to the number of off-cells.

9. The read method of a nonvolatile memory device of claim 8, wherein the first unselect read voltage is controlled to have the same level as the second unselect read voltage.

10. The read method of a nonvolatile memory device of claim 6, wherein in the step of determining whether a selected word line comprises LSB page only programmed memory cells by applying a first read voltage to the selected word line, in the case a flag cell included in the selected word line is in an erase state, the selected word line is determined to be a word line including LSB page only programmed memory cells.

11. A read method of a nonvolatile memory device, the method comprising:
    determining whether a flag cell included in a selected word line is turned on by applying a first select read voltage to the selected word line;

in the case that the selected word line is turned on, counting the number of fail bits by applying the first select read voltage to the selected word line; and in the case that the number of fail bits is greater than a first reference value, performing a read operation by applying a first additional select read voltage higher than a second select read voltage, wherein the second select read voltage has a level for distinguishing between an erase state and a program state adjacent to the erase state.

12. The read method of a nonvolatile memory device of claim 11, wherein in the case that the number of fail bits is greater than the first reference value, a first unselect read voltage being applied to at least one word line adjacent to the selected word line between the selected word line and a string select line is decreased.

13. The read method of a nonvolatile memory device of claim 11, wherein the performing the read operation, in the case that the number of fail bits is greater than a second reference value, and equal to or smaller than the first reference value, comprises performing a read operation by applying a second additional select read voltage higher than the second select read voltage and lower than the first additional select read voltage.

14. The read method of a nonvolatile memory device of claim 13, wherein in the case that the number of fail bits is greater than the second reference value, and equal to or smaller than the first reference value, a first unselect read voltage being applied to at least one word line adjacent to the selected word line between the selected word line and a string select line is decreased.

15. The read method of a nonvolatile memory device of claim 13, wherein the performing the read operation comprises:

in the case that the number of fail bits is equal to or smaller than the second reference value, applying the second select read voltage to the selected word line;

decreasing a first unselect read voltage applied to at least one word line adjacent to the selected word line between the selected word line and a string select line; and decreasing a second unselect read voltage applied to at least one word line adjacent to the selected word line between the selected word line and a ground select line.

16. The read method of a nonvolatile memory device of claim 15, wherein the first unselect read voltage is controlled to apply the same level as the second unselect read voltage.

17. A nonvolatile memory device comprising:

a memory cell array comprising memory cells and flag cells that are connected to one another through word lines; and a control logic determining whether a selected word line comprises LSB (least significant bit) page only programmed memory cells by applying a first select read voltage to a flag cell connected to the selected word line, wherein the control logic determines whether a second select read voltage is changed by applying the first select read voltage to the selected word line to compare the number of detected fail bits with predetermined reference values, and wherein the second select read voltage has a level for distinguishing between an erase state and a program state adjacent to the erase state.

18. The nonvolatile memory device of claim 17, wherein the control logic, in the case that the flag cell is in the erase state, determines that the selected word line comprises LSB page only programmed memory cells.

19. The nonvolatile memory device of claim 17, wherein the control logic comprises a coupling amount detector detecting a coupling amount when the first select read voltage is applied to the selected word line, wherein the coupling amount detector comprises:

a fail bit counter detecting the number of fail bits when the first select read voltage is applied to the selected word line;

a comparator comparing the number of fail bits with the predetermined reference values; and a voltage change circuit changing the second select read voltage according to the comparison result.

20. The nonvolatile memory device of claim 17, wherein the memory cell array comprises a three-dimensional memory array, wherein the three-dimensional array is monolithically formed in at least one physical level of memory cells having active areas being disposed on a silicon substrate, wherein each of the memory cells comprises a charge trap layer, and wherein word lines or bit lines of the three-dimensional memory array are shared among levels constituting the three-dimensional memory array.

* * * * *